(12) United States Patent
Ravasio et al.

(10) Patent No.: US 10,854,674 B2
(45) Date of Patent: Dec. 1, 2020

(54) CROSS-POINT MEMORY AND METHODS FOR FABRICATION OF SAME

(71) Applicant: Micron Technology, Inc., Boise, ID (US)

(72) Inventors: Marcello Ravasio, Olgiate Molgora (IT); Samuele Sciarrillo, Boise, ID (US); Fabio Pellizzer, Boise, ID (US); Innocenzo Tortorelli, Cernusco sul Naviglio (IT); Roberto Somaschini, Vimercate (IT); Cristina Casellato, Sulbiate (IT); Riccardo Mottadelli, Verano Brianza (IT)

(73) Assignee: Micron Technology, Inc., Boise, ID (US)

(*) Notice: Subject to any disclaimer, the term of this patent is extended or adjusted under 35 U.S.C. 154(b) by 20 days.

(21) Appl. No.: 15/693,102

(22) Filed: Aug. 31, 2017

(65) Prior Publication Data

US 2017/0365642 A1    Dec. 21, 2017

Related U.S. Application Data

(62) Division of application No. 14/189,490, filed on Feb. 25, 2014, now Pat. No. 9,806,129.

(51) Int. Cl.
    *H01L 27/24*    (2006.01)
    *H01L 45/00*    (2006.01)

(52) U.S. Cl.
    CPC ...... *H01L 27/2463* (2013.01); *H01L 27/2427* (2013.01); *H01L 45/06* (2013.01);
    (Continued)

(58) Field of Classification Search
    CPC .............................. H01L 27/2463; H01L 45/12
    See application file for complete search history.

(56) References Cited

U.S. PATENT DOCUMENTS

| 6,084,284 A | 7/2000 | Adamic |
| 6,404,003 B1 | 6/2002 | McMillian et al. |

(Continued)

FOREIGN PATENT DOCUMENTS

| JP | 2006079609 A | 3/2006 |
| JP | 2009218259 A | 9/2009 |

(Continued)

OTHER PUBLICATIONS

Korean Intellectual Property Office, "Office Action," issued in connection with Korean Patent Application No. 10-2018-7038032, dated Mar. 18, 2019 (9 pages).

(Continued)

*Primary Examiner* — Moazzam Hossain
(74) *Attorney, Agent, or Firm* — Holland & Hart LLP

(57) ABSTRACT

The disclosed technology relates generally to integrated circuit devices, and in particular to cross-point memory arrays and methods for fabricating the same. In one aspect, a method of fabricating cross-point memory arrays comprises forming a memory cell material stack which includes a first active material and a second active material over the first active material, wherein one of the first and second active materials comprises a storage material and the other of the first and second active materials comprises a selector material. The method of fabricating cross-point arrays further comprises patterning the memory cell material stack, which includes etching through at least one of the first and second active materials of the memory cell material stack, forming protective liners on sidewalls of the at least one of the first and second active materials after etching through the one of the first and second active materials, and further etching the memory cell material stack after forming the protective liners on the sidewalls of the one of the first and second active materials.

6 Claims, 18 Drawing Sheets

(52) U.S. Cl.
CPC .......... *H01L 45/12* (2013.01); *H01L 45/1233* (2013.01); *H01L 45/1675* (2013.01); *H01L 45/144* (2013.01)

(56) References Cited

U.S. PATENT DOCUMENTS

| | | | |
|---|---|---|---|
| 6,486,070 | B1 | 11/2002 | Ho et al. |
| 6,635,498 | B2 | 10/2003 | Summerfelt et al. |
| 6,869,880 | B2 | 3/2005 | Krishnaraj et al. |
| 6,903,031 | B2 | 6/2005 | Karim et al. |
| 7,482,616 | B2 | 1/2009 | Song |
| 7,491,600 | B2 | 2/2009 | Prinz et al. |
| 7,579,251 | B2 | 8/2009 | Imanaka et al. |
| 7,646,630 | B2 | 1/2010 | Lowrey |
| 7,700,472 | B2 | 4/2010 | Kim |
| 7,741,638 | B2 | 6/2010 | Stewart et al. |
| 7,838,860 | B2 | 11/2010 | Happ et al. |
| 7,852,658 | B2 | 12/2010 | Liu et al. |
| 7,875,516 | B2 | 1/2011 | Knoefler et al. |
| 7,936,027 | B2 | 5/2011 | Xiao et al. |
| 7,939,815 | B2 | 5/2011 | Lee |
| 8,093,128 | B2 | 1/2012 | Koutny |
| 8,129,705 | B2 | 3/2012 | Kinoshita et al. |
| 8,143,610 | B2 | 3/2012 | Park et al. |
| 8,153,527 | B2 | 4/2012 | Loh et al. |
| 8,203,134 | B2 | 6/2012 | Liu |
| 8,344,513 | B2 | 1/2013 | Yu et al. |
| 8,440,535 | B2 | 5/2013 | Dennison |
| 8,450,714 | B2 | 5/2013 | Yasutake |
| 8,467,219 | B2 | 6/2013 | Lue |
| 8,519,371 | B2 | 8/2013 | Fukumizu et al. |
| 8,536,015 | B2 * | 9/2013 | Scheuerlein ........... B82Y 10/00 257/2 |
| 8,575,019 | B2 | 11/2013 | Zhao |
| 8,575,584 | B2 | 11/2013 | Satoh |
| 8,613,863 | B2 | 12/2013 | Tong et al. |
| 8,623,697 | B2 | 1/2014 | Magistretti et al. |
| 8,748,877 | B2 | 6/2014 | Orita et al. |
| 8,765,581 | B2 | 7/2014 | Lee et al. |
| 8,766,226 | B2 | 7/2014 | Nojiri |
| 8,822,968 | B2 | 9/2014 | Inokuma |
| 8,937,292 | B2 | 1/2015 | Bateman |
| 9,012,326 | B2 | 4/2015 | Kim et al. |
| 9,093,632 | B2 | 7/2015 | Tsubata |
| 9,129,913 | B2 | 9/2015 | Lee |
| 9,136,307 | B2 | 9/2015 | Pellizzer |
| 9,171,913 | B2 | 10/2015 | Kim et al. |
| 9,196,849 | B2 | 11/2015 | Jung et al. |
| 9,224,615 | B2 | 12/2015 | Chang et al. |
| 9,245,926 | B2 | 1/2016 | Kau et al. |
| 9,406,877 | B2 | 8/2016 | Tada et al. |
| 9,748,311 | B2 | 8/2017 | Fantini et al. |
| 2006/0056233 | A1 | 3/2006 | Parkinson et al. |
| 2007/0166980 | A1 | 7/2007 | Lee et al. |
| 2007/0275560 | A1 | 11/2007 | Nishimura et al. |
| 2008/0293207 | A1 | 11/2008 | Koutny et al. |
| 2009/0251944 | A1 | 10/2009 | Happ et al. |
| 2009/0302362 | A1 | 12/2009 | Kikuchi et al. |
| 2010/0032637 | A1 | 2/2010 | Kinoshita et al. |
| 2011/0227017 | A1 | 9/2011 | Yasutake |
| 2011/0244666 | A1 | 10/2011 | Kim et al. |
| 2012/0119178 | A1 * | 5/2012 | Scheuerlein ........... B82Y 10/00 257/2 |
| 2012/0220099 | A1 | 8/2012 | Dennison |
| 2012/0235109 | A1 * | 9/2012 | Nojiri .................. H01L 27/101 257/4 |
| 2012/0313064 | A1 | 12/2012 | Nishimura |
| 2012/0315384 | A1 | 12/2012 | Abd Elhamid et al. |
| 2013/0016557 | A1 | 1/2013 | Kim |
| 2013/0207068 | A1 | 8/2013 | Pellizzer |
| 2013/0248796 | A1 | 9/2013 | Inokuma |
| 2013/0333835 | A1 | 12/2013 | Carcia |
| 2014/0170234 | A1 | 6/2014 | Epps et al. |
| 2014/0273524 | A1 | 9/2014 | Nguyen |
| 2015/0041749 | A1 | 2/2015 | Liu |
| 2015/0137061 | A1 | 5/2015 | Donghi et al. |
| 2015/0179706 | A1 | 6/2015 | Rocklein |
| 2015/0243708 | A1 | 8/2015 | Ravasio et al. |
| 2015/0243885 | A1 | 8/2015 | Sciarrillo |
| 2015/0287916 | A1 | 10/2015 | Campbell et al. |
| 2016/0056208 | A1 | 2/2016 | Pellizzer et al. |

FOREIGN PATENT DOCUMENTS

| | | |
|---|---|---|
| JP | 2011199035 A | 10/2011 |
| JP | 2011222994 A | 11/2011 |
| JP | 2012195530 A | 10/2012 |
| KR | 1020040068024 | 7/2004 |
| KR | 1020080060321 | 7/2008 |
| KR | 1020100018445 | 2/2010 |
| WO | 2015088921 A1 | 6/2015 |

OTHER PUBLICATIONS

Gonzalez, et al., "Charge Trapping Analysis of $Al_2O_3$ Films Deposited by Atomic Layer Deposition using $H_2O$ or $O_3$ as Oxidant", Journal of Vacuum Science & Technology B 31 (2013) 01A101, 6 pgs.

Lee, et al., "Alucone Alloys with Tunable Properties Using Alucone Molecular Layer Deposition and $Al_2O_3$ Atomic Layer Deposition", The Journal of Physical Chemistry C, 116 (2012), pp. 3250-3257.

Lee, et al., "Growth and Properties of Hybrid Organic-Inorganic Metalcone Films Using Molecular Layer Deposition Techniques", Advanced Functional Materials 23 (2013), pp. 532-546.

Miller, et al., "Thermo-Mechanical Properties of Alumina Films Created Using the Atomic Layer Deposition Technique", Sensors and Actuators A:Physical 164 (2010), pp. 58-67.

Miller, et al., "Thermomechanical Properties of Aluminum Alkoxide (alucone) films created using molecular layer deposition", Acta Materialia, Inc. 57 (2009), pp. 5083-5092.

Sniegowski, et al., "IC-Compatible Polysilicon Surface Micromachining", Annu. Rev. Mater. Sci. 30 (2000), pp. 299-333.

Yoon, et al., "Molecular Layer Deposition of Hybrid Organic-Inorganic Alucone Polymer Films Using a Three-Step ABC Reaction Sequence", Chemistry of Materials, 21 (2009), pp. 5365-5374.

Dameron et al., "Molecular layer deposition of alucone polymer films using trimethylaluminum and ethylene glycol", Chemical Materials, vol. 20, pp. 3315-3326 (2008).

ISA/KR, International Search Report and Written Opinion of the International Searching Authority, Int'l. Appl. No. PCT/US2015/015023, dated May 7, 2015, Korean Intellectual Property Office, Seo-gu, Daejon, Republic of Korea, 13 pgs.

Jen et al., "Critical tensile strain and water vapor transmission rate for nanolaminate films grown using $Al_2O_3$ atomic layer disposition and alucone molecular layer deposition", Applied Physics Letters, vol. 101, 234103; 3 pages (2012).

Lai, "Current Status of the Phase Change Memory and its Future," Electron Devices Meeting, Dec. 8-10, 2003, pp. 10.1.1-10.1.4, IEDM '03 Technical Digest. IEEE International.

Liu et al., "Fabrication of the Si2Sb2Te5 phase change cell structure for PCRAM by using UV nanoimprint lithography," 2008 2nd IEEE International Nanoelectronics Conference, Mar. 24-27, 2008, pp. 807-810, IEEE, 2008.

Seghete et al., "Sacrificial layers for air gaps in NEMS using alucone molecular layer deposition", Sensors and Actuators A: Physical; 8 pages (2009).

Intellectual Property Office of Singapore, "Written Opinion", issued in connection with Application No. 11201606642T, dated Jun. 24, 2019, 6 pgs.

Japanese Patent Office, "Office Action," issued in connection with Japanese Patent Application No. 2018-140688, dated Aug. 20, 2019 (8 pages).

Japanese Patent Office, "Decision to Grant a Patent," issued in connection with Japanese Patent Application No. 2016-553546, dated Feb. 25, 2020 (2 pages).

European Patent Office, "Search Report," issued in connection with European Patent Application No. 20185833.9, dated Sep. 24, 2020 (7 pages).

(56) References Cited

OTHER PUBLICATIONS

Intellectual Property Office of Singapore, "Examination Report," issued in connection with Singapore Patent Application No. 11201606642T, dated Mar. 24, 2020 (5 pages).

* cited by examiner

CROSS-POINT MEMORY AND METHODS FOR FABRICATION OF SAME

CROSS REFERENCE

The present Application for patent is a divisional of U.S. patent application Ser. No. 14/189,490 by Ravasio et al., entitled "Cross-Point Memory and Methods for Fabrication of Same," filed Feb. 25, 2014, assigned to the assignee hereof, and is expressly incorporated by reference in its entirety herein.

REFERENCE TO RELATED APPLICATIONS

This application is related to U.S. patent application Ser. No. 14/189,265 by Sciarillo, entitled "Cross-Point Memory and Methods for Fabrication of Same," filed Feb. 25, 2014, now U.S. Pat. No. 9,577,010, and U.S. patent application Ser. No. 14/189,323 by Song et al., entitled "Semiconductor Structures Including Liners Comprising Alucone and Related Methods," filed Feb. 25, 2014, now U.S. Pat. No. 9,484,196.

BACKGROUND OF THE INVENTION

Field of the Invention

Subject matter disclosed herein generally relates to integrated circuit devices, and in particular to cross-point memory arrays and methods for fabricating the same.

Description of the Related Art

Generally, a cross-point memory array refers to a memory array having memory elements disposed and electrically connected at cross-junctions between a first set of conductive lines (e.g., word lines) and a second set of conductive lines (e.g., bit lines) overlapping and crossing the first set of conductive lines. Some cross-point memory arrays incorporate materials whose resistance can be changed by a signal applied across the memory elements. Examples of resistance change materials include phase change materials.

Fabrication of cross-point memory arrays can include patterning the memory elements having multiple elements in a stacked configuration. Patterning the memory elements, which often involve etching at least portions of a stack of materials to form a stacked structure, for example a stack of lines, can result in undesirable effects such as damaging and contaminating sidewalls of the stacked structure being etched. Thus, there is a need for fabrication methods that can minimize such undesirable effects.

BRIEF DESCRIPTION OF THE DRAWINGS

Claimed subject matter is particularly pointed out in the concluding portion of the specification. However, organization and/or method of operation, together with certain objects, features, and/or advantages thereof, may be better understood by reference to the following detailed description if read with the accompanying drawings in which:

DETAILED DESCRIPTION

Figure 1:
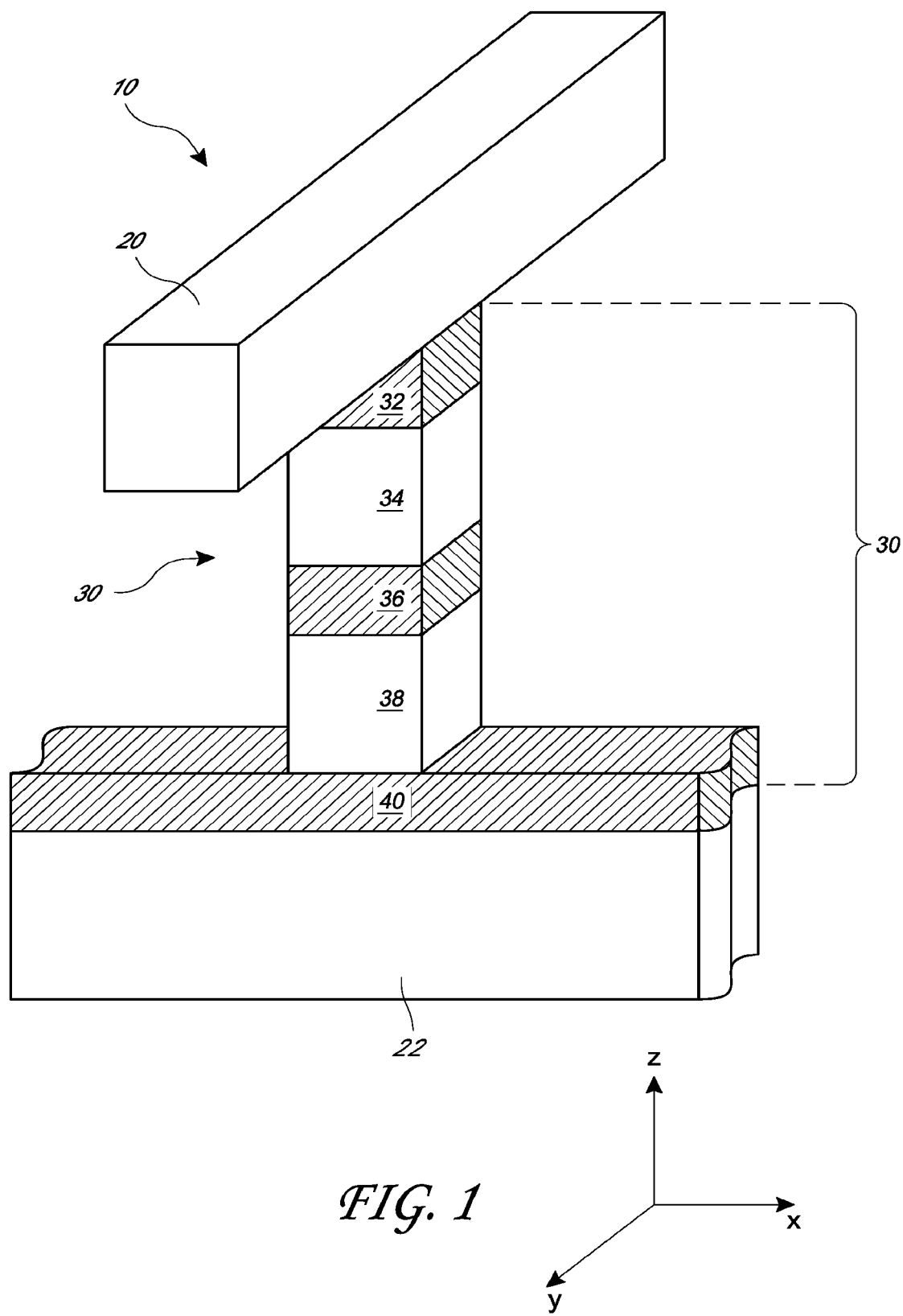
FIG. 1 is a schematic three-dimensional depiction of a memory cell according to some embodiments.

As noted above, generally, a cross-point memory array refers to a memory array having memory cells disposed and electrically connected at cross junctions between a first set of conductive lines (e.g., word lines) and a second set of conductive lines (e.g., bit lines) overlapping and crossing the first set of conductive lines. The memory cells can change their memory state in response to a signal, which can be an electrical signal such as a voltage or a current pulse. Some memory cells, sometimes called the resistance change cells, incorporate resistance change materials whose electrical resistance can be changed by the electrical signals provided through the first and second conductive lines connected to the resistance change materials. One category of such resistance change materials is that of phase change materials, such as but not limited to chalcogenide materials.

The memory cells in a cross-point memory array can include multiple elements arranged in a stacked configuration. For example, a memory cell can include a storage element and a selector element, and can also include electrodes connecting the storage and selector elements and further connecting the storage and selector elements to conductive lines. Such electrodes may be employed to prevent reaction or interdiffusion between neighboring functional elements, but may not be employed depending upon the selected materials. Patterning the memory cell having the multiple elements, which often involves etching at least portions of a stack of materials to form a stacked structure, for example a stack of lines, can result in undesirable effects such as damaging and/or cross-contaminating sidewalls of the stacked structure being etched. For example, during etching, sidewalls of one of the storage or selector elements can become damaged chemically and/or physically. Cross-contamination can occur from redeposition of one of the etched materials and/or etch byproducts onto another element. For example, elements from a selector material can contaminate sidewalls of a storage material, or vice versa. Similar damage and/or cross-contamination can occur among one or more of materials of the storage or selector elements, electrode materials, conductive line materials, or any other material that may be etched as part of the stack etch process. In addition, contaminants can be thermally "driven-in" in subsequent processes, thereby causing unintended and undesirable effects on the final device characteristics as well as fabrication yield. Thus, there is a need for fabrication methods that can minimize such undesirable effects.

A method of fabricating a memory device according to some embodiments comprises forming a memory cell material stack and patterning the memory cell material stack. Forming the memory cell material stack includes forming, e.g., depositing, a first active material and a second active material over the first active material. In some embodiments, one of the first and second active materials comprises a storage material and the other of the first and second active materials comprises a selector material. Patterning the memory cell material stack can include etching through a portion of the memory cell material stack, such as through at least one of the first and second active materials of the memory cell material stack, and forming protective liners on the sidewalls prior to completion of the etching of the entire memory cell material stack. After forming the protective liners, the cell material stack can be further etched to complete the cell stack etch. Thus, the portion of the memory cell stack whose sidewalls are covered with the protective liners are protected during further etching of the cell stack such that etch products that may be liberated during further etching of the cell stack are prevented from contaminating the portion whose sidewalls are covered with the protective liner. Etching can be dry etching, including physical etching, chemical etching, or a combination of the two as in a reactive ion etch.

FIG. 1 depicts a memory cell 10 in a cross-point memory array according to one embodiment. The memory cell 10 in FIG. 1 is a resistance change memory cell arranged in a stacked configuration between a column line 20 extending in a y direction and a row line 22 extending in an x direction. While a single memory cell 10 interposed between one column line 20 and one row line 22 is illustrated, it will be understood that a memory array can include additional memory cells formed at a plurality of crossings between a plurality of column lines 20 and a plurality of row lines 22. Column lines 20 can alternately be referred to as bit lines or digit lines, or more generally as access lines, and row lines 22 can alternately be referred to as word lines, or also more generally as access lines, by convention in the industry, although these designations can also be reversed. The row and column lines 22 and 20 are conductive lines configured to carry electrical signals such as, for example, a voltage or a current pulse, between cells in an array and driver circuitry. The memory cell 10 includes a memory cell stack 30 including a selector element 38 and a storage element 34, and in the illustrated embodiment these elements are separated by a middle electrode 36. The memory cell stack 30 additionally includes a first electrode 40 between the selector element 38 and the row line 22 and a second electrode 32 between the column line 20 and the storage element 34.

Embodiments modified from the illustrated embodiments of FIG. 1 are possible. For example, while the illustrated embodiment in FIG. 1 shows the first electrode 40 configured as a line structure laterally confined in one dimension and extending in the x-direction above the column line 22 and the second electrode 32 configured as a structure laterally confined in two dimensions, the opposite configuration is possible, where the first electrode 40 is configured as a structure laterally confined in two dimensions and the second electrode 32 is configured as a line structure laterally confined in one dimension and extending in the y-direction below the row line 20. In other embodiments, both the first and second electrodes 40 and 32 can be laterally confined in one or two dimensions. In addition, in other embodiments, the positions of the storage element 34 and the selector element 38 within a stack configuration may be interchanged with one another. In yet other embodiments, the selector element 38 may be omitted. In yet other embodiments, any one of the first, second, and middle electrodes may be omitted, depending upon compatibility or reactivity of adjacent storage, selector and conductive line materials. Additionally, the "row" and "column" designations are interchangeable, and the rows and columns are generally perpendicular but may cross one another at other than 90°.

Examples of the storage element 34 include a chalcogenide-based phase change storage element, a resistive random access memory (RRAM) storage element (e.g., NiO, $HfO_2$, $ZrO_2$, $Cu_2O$, $TaO_2$, $Ta_2O_5$, $TiO_2$, $SiO_2$, $Al_2O_3$), a conductive bridge random access memory (CBRAM) storage element (e.g., metal-doped chalcogenide), and/or a spin transfer torque random access memory (STT-RAM) storage element, among other types of storage elements.

Examples of the selector element 38 include a two terminal device (e.g., a switch), such as a diode, an ovonic threshold switch (OTS), a tunnel junction, or a mixed ionic electronic conduction switch (MIEC), among other two terminal devices. Alternatively, examples of the selector element 38 include a three terminal device (e.g., a switch), such as a field effect transistor (FET) or a bipolar junction transistor (BJT), among other switching elements.

In some embodiments, one or both of the storage and selector elements 34 and 38 can comprise chalcogenide materials. When both storage and selector elements 34 and 38 comprise chalcogenide materials, the storage element 34 can comprise a chalcogenide material that can undergo a phase change that is nonvolatile at room temperature. On the other hand, the selector element 38 can comprise a chalcogenide material that does not undergo a similar nonvolatile phase change.

In some embodiments, the storage element 34 includes a phase change material that includes chalcogenide compositions such as an alloy including at least two of the elements within the indium(In)-antimony(Sb)-tellurium(Te) (IST) alloy system, e.g., $In_2Sb_2Te_5$, $In_1Sb_2Te_4$, $In_1Sb_4Te_7$, etc., or an alloy including at least two of the elements within the germanium(Ge)-antimony(Sb)-tellurium(Te) (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage elements include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

In some embodiments, the selector element 38 includes a chalcogenide material electrically coupled to the storage element 34 through the middle electrode 36 on one side and electrically connected to the row line 22 through the first electrode 40 on the other side. A selector device having a chalcogenide material can sometimes be referred to as an Ovonic Threshold Switch (OTS). An OTS may include a chalcogenide composition including any one of the chalcogenide alloy systems described above for the storage element 34. In addition, the selector element may further comprise an element to suppress crystallization, such as arsenic (As). Examples of OTS materials include Te—As—Ge—Si, Ge—Te—P*b*, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

The electrodes 32, 36 and 40 can comprise materials that electrically connect the operational elements of the memory cell but prevent reactions among the materials. For example, where the storage element 34 and the selector element 38 comprise chalcogenide materials, it may be advantageous to place non-reactive conductors between these elements to prevent interdiffusion of their materials, and also between these elements and their respective neighboring conductive lines, particularly conductive lines formed of metallic material. Examples of suitable electrode materials include one or more conductive and semiconductive materials such as, for example, carbon (C); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$.

In addition, row lines 22 and column lines 20 can comprise any conductive and/or semiconductive material suitable for forming conductive lines to carry electrical current for accessing the memory cells within the memory array. Examples of conductive/semiconductive materials suitable for forming row lines 22 and column lines 20 include n-doped or p-doped polysilicon; metals including Al, Cu, and W; conductive metal nitrides including TiN, TaN, and TaCN; and other conductive materials. In embodiments where one of electrodes 32 or 40 is omitted, the row line 22 or column line 20 can serve as cell electrodes in addition to carrying electrical signals.

In the following, it will be understood that while some embodiments of memory cells may be described as having certain features pertaining to storage elements and selector elements that include chalcogenide materials, the embodiments are not limited to such storage and selector materials. For example, in some embodiments, a memory cell can include a storage element including a chalcogenide phase change material, while including a selector element that does not include a chalcogenide material, such as a bipolar junction transistor or a diode. In some other embodiments, another material with similar electrical behavior as a chalcogenide phase change material may be used. In some other embodiments, a memory cell can include a selector element including an Ovonic threshold switching material, while including a storage element that does not include a chalcogenide material, such an oxide-based resistance change oxide material. In yet other embodiments, a memory cell can include a chalcogenide phase change material having both storage and selector functionalities without separate selector elements for these functions.

Figure 2A:
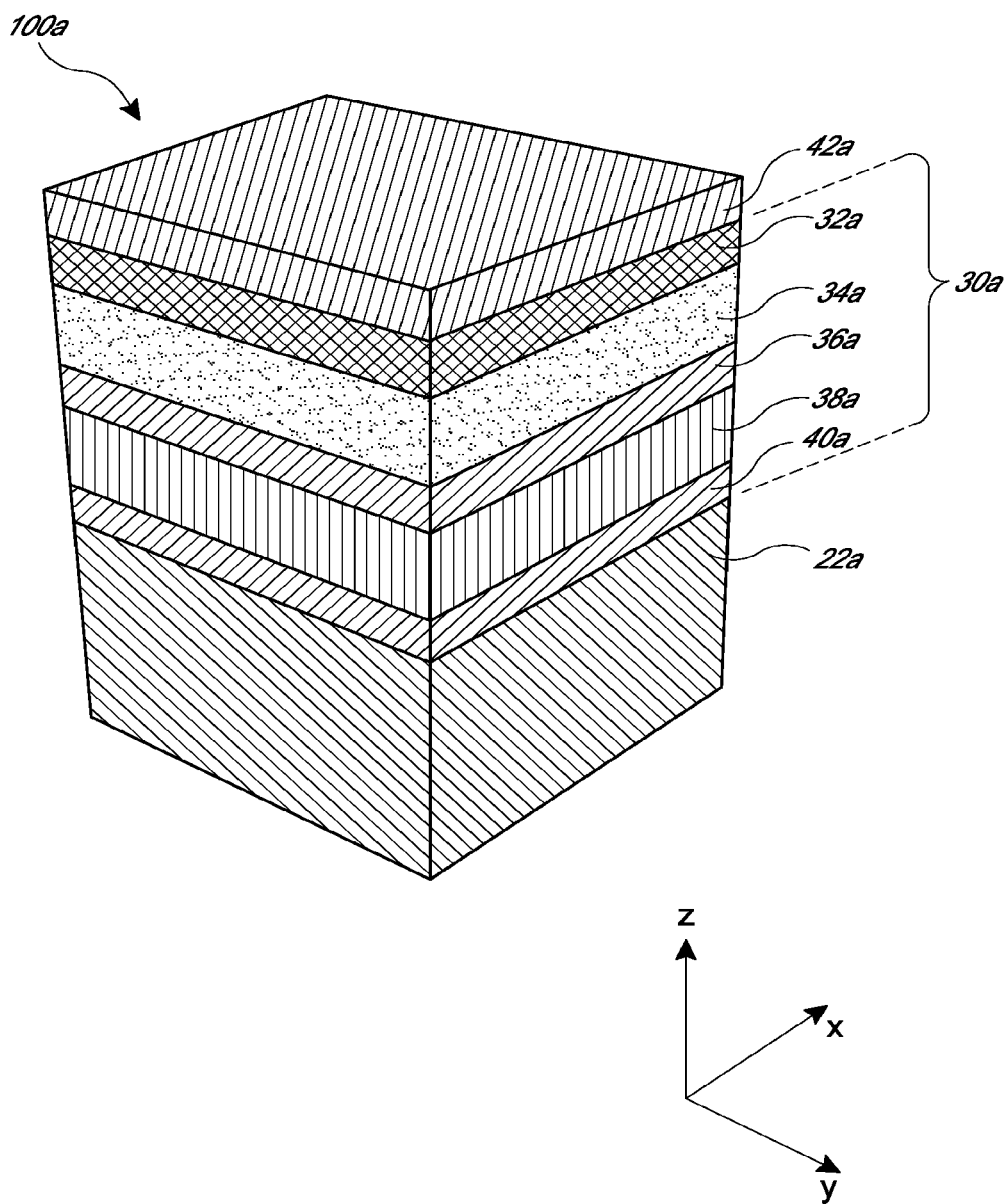
FIGS. 2A-2N are schematic three-dimensional depictions of intermediate structures of a memory cell at various stages of fabrication according to some embodiments.
Figure 2B:
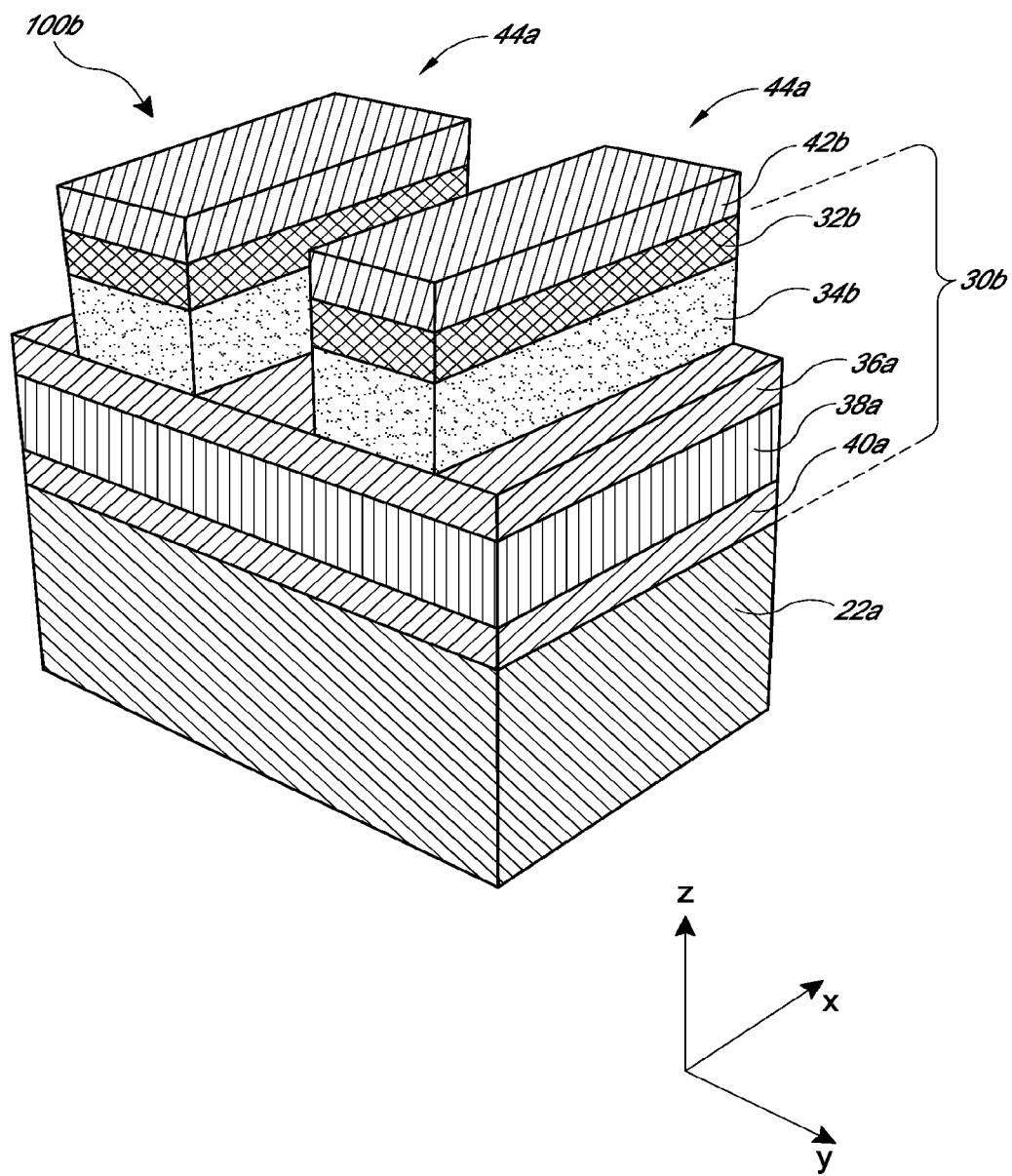
Figure 2C:
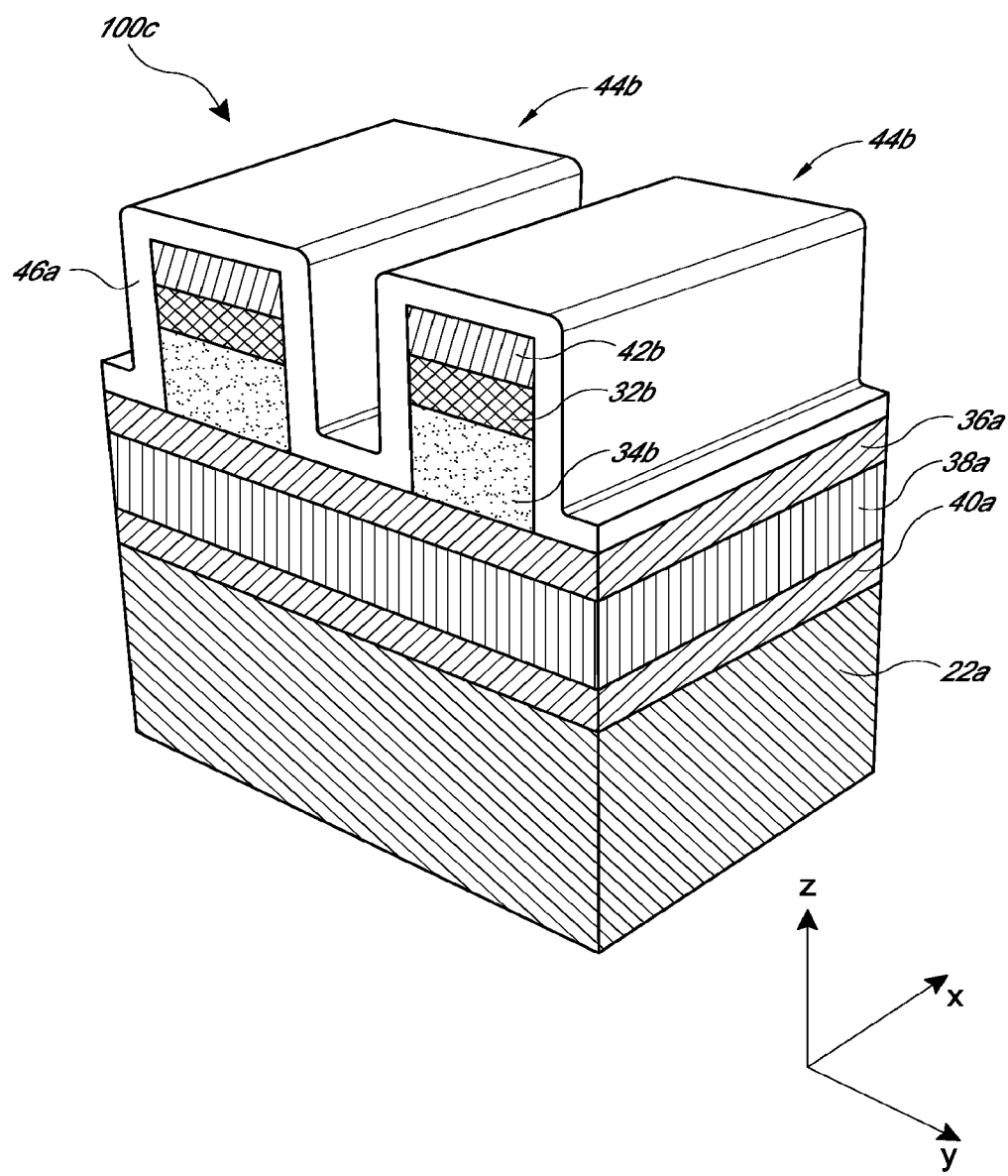
Figure 2D:
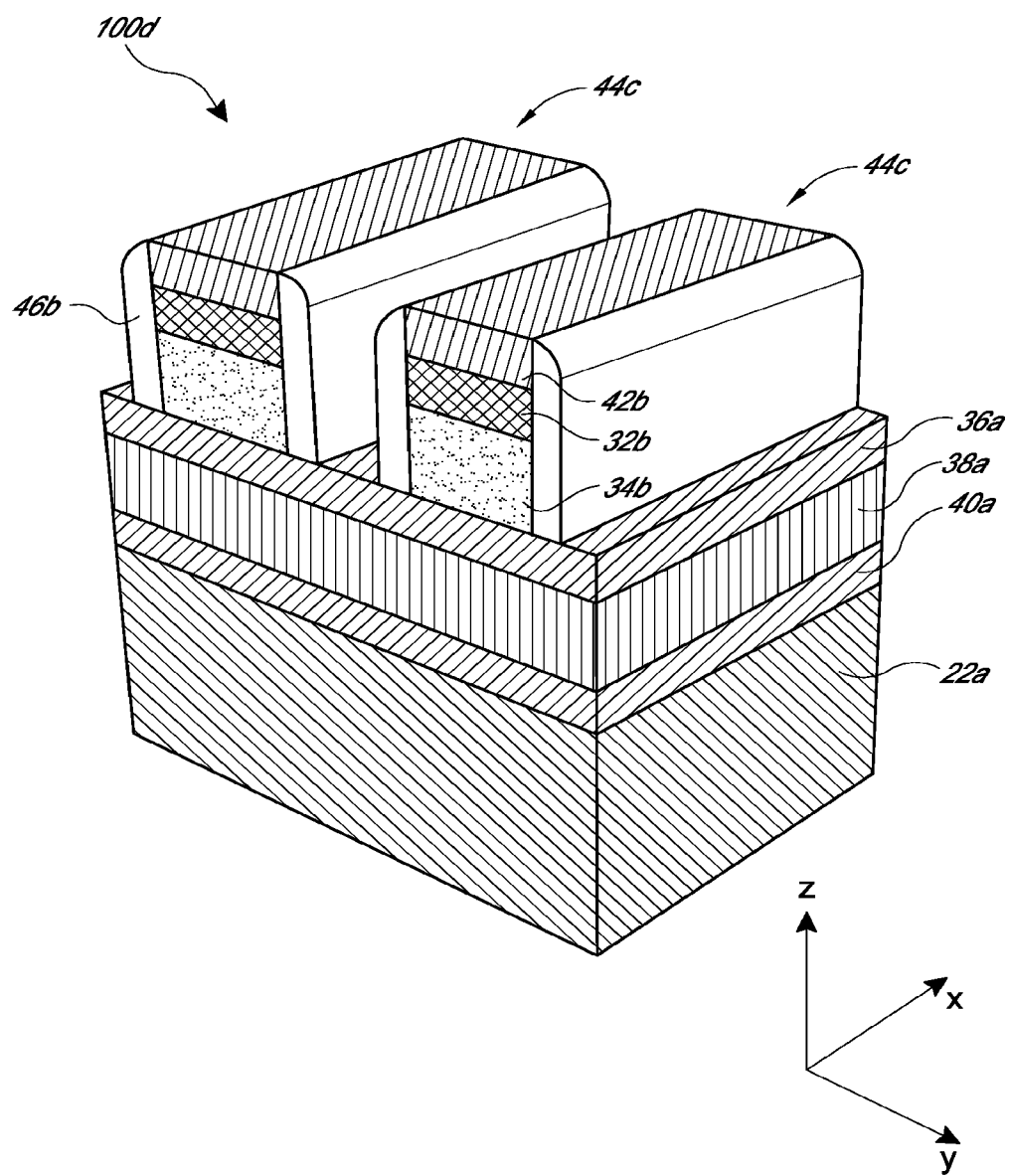
Figure 2E:
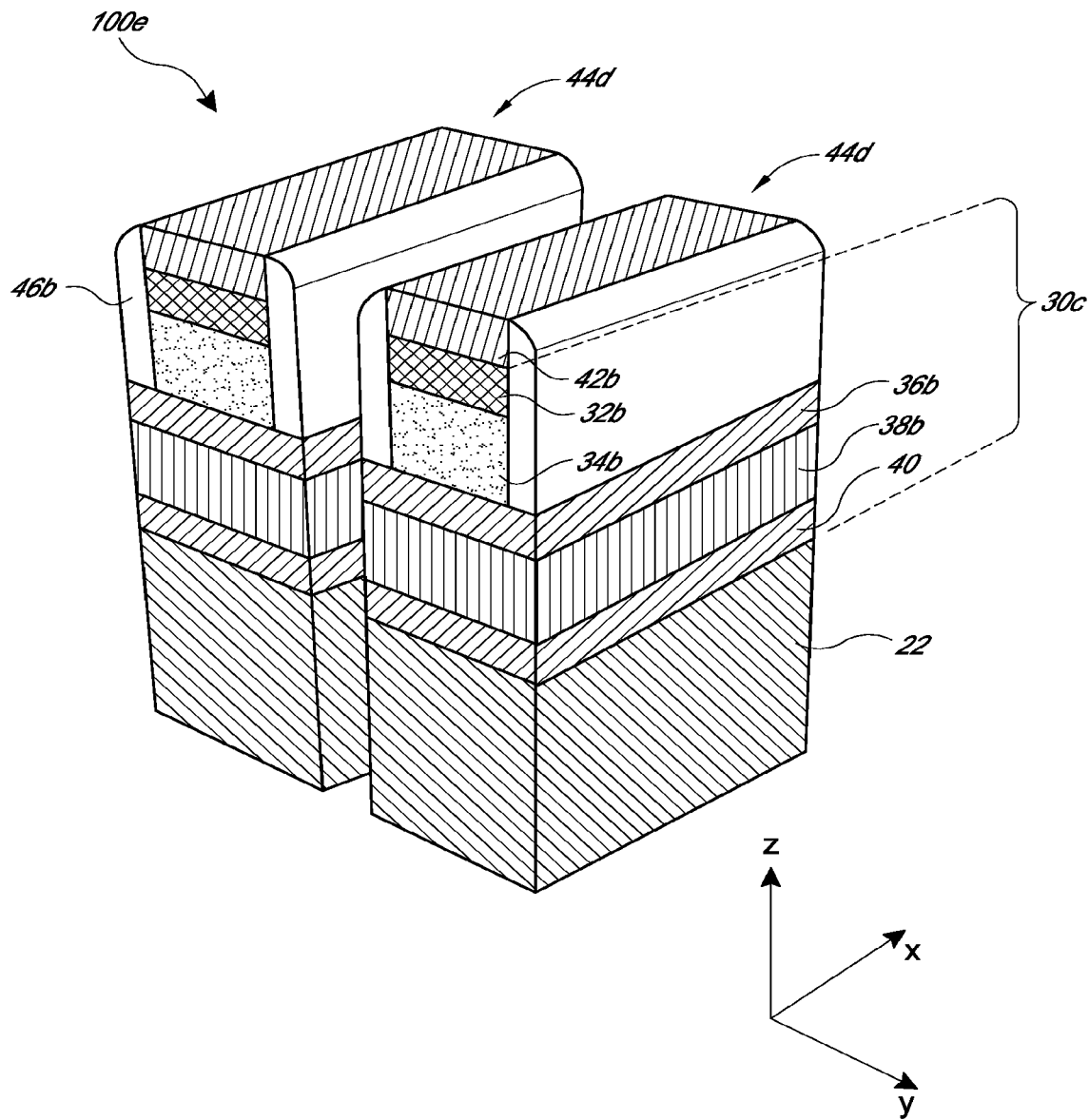
Figure 2F:
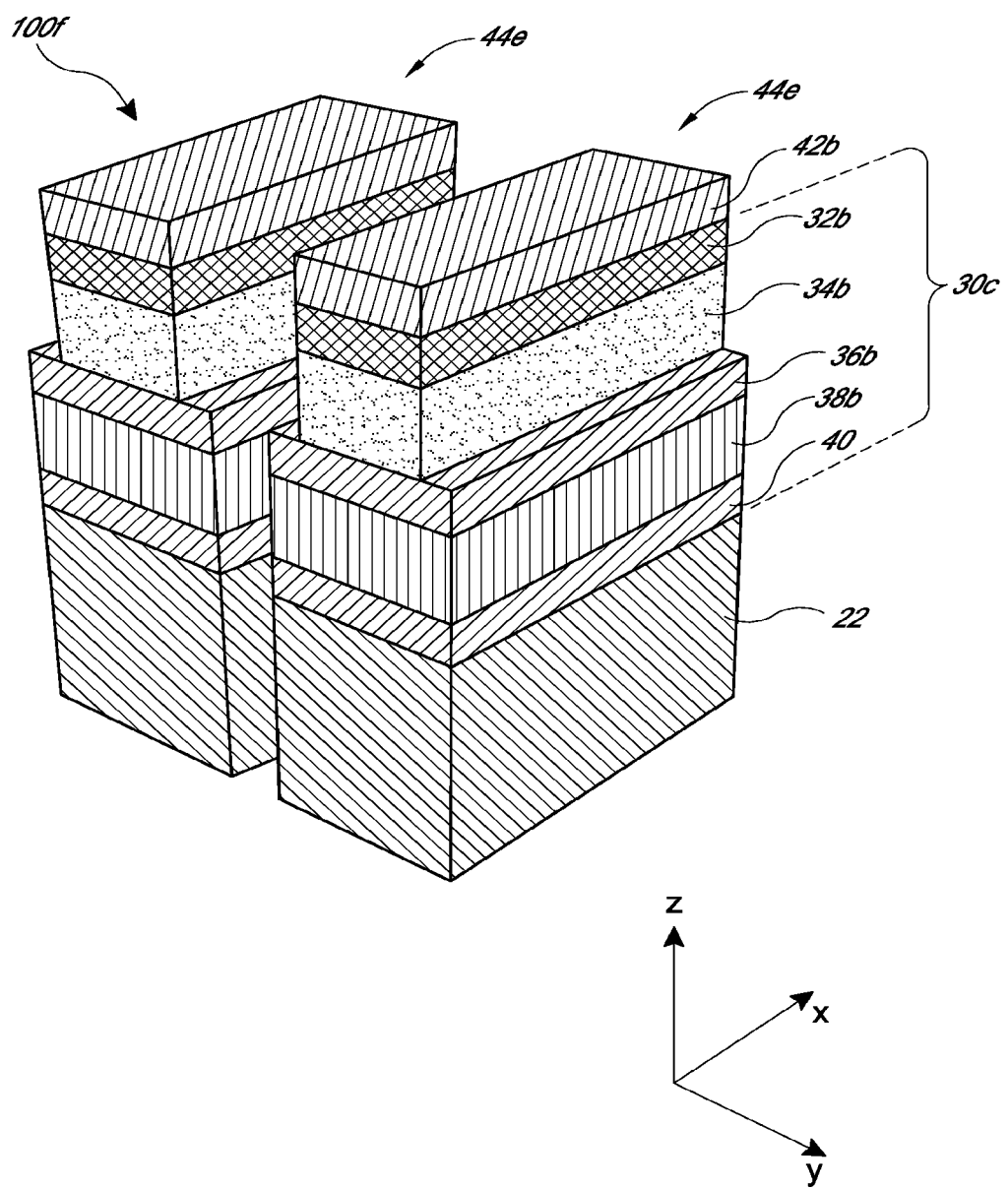
Figure 2G:
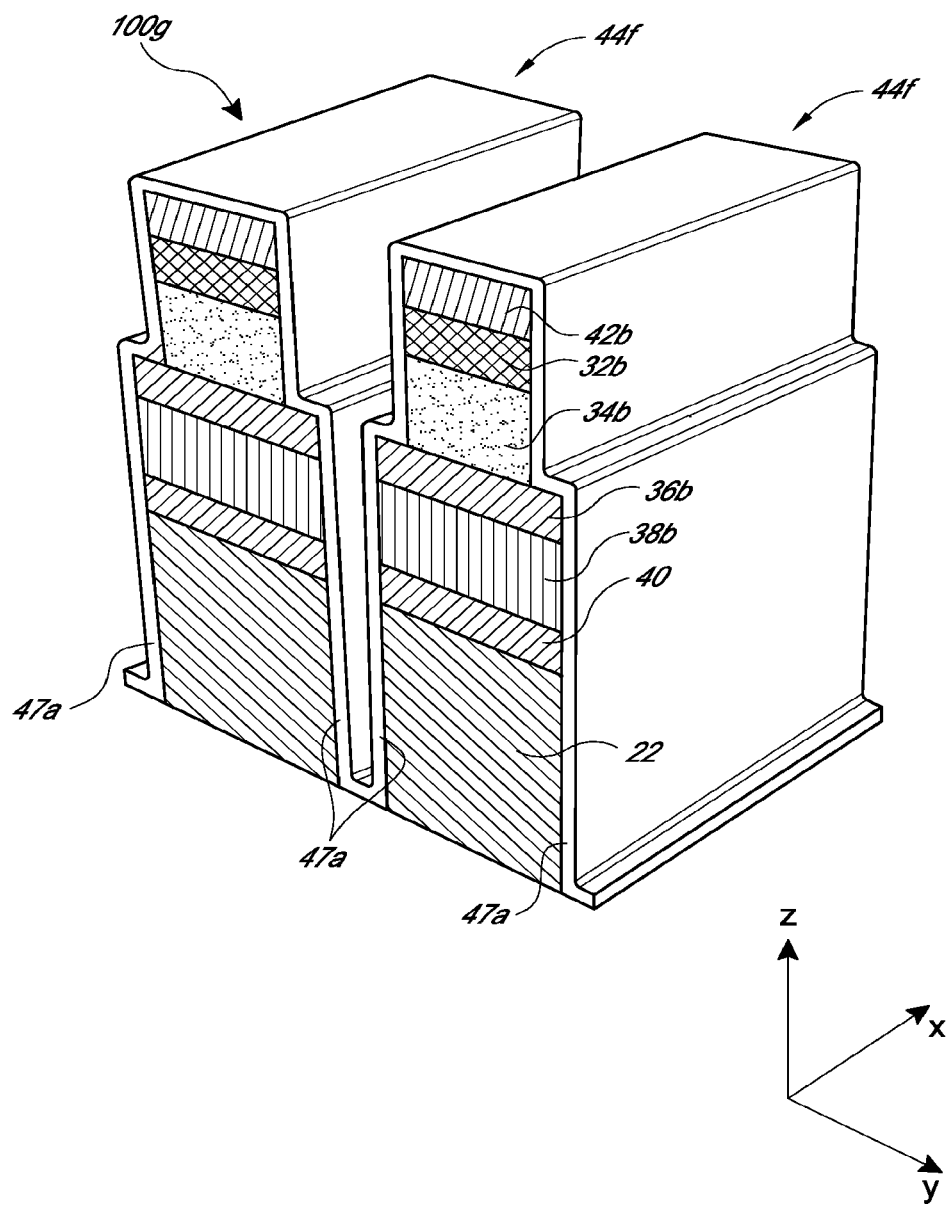
Figure 2H:
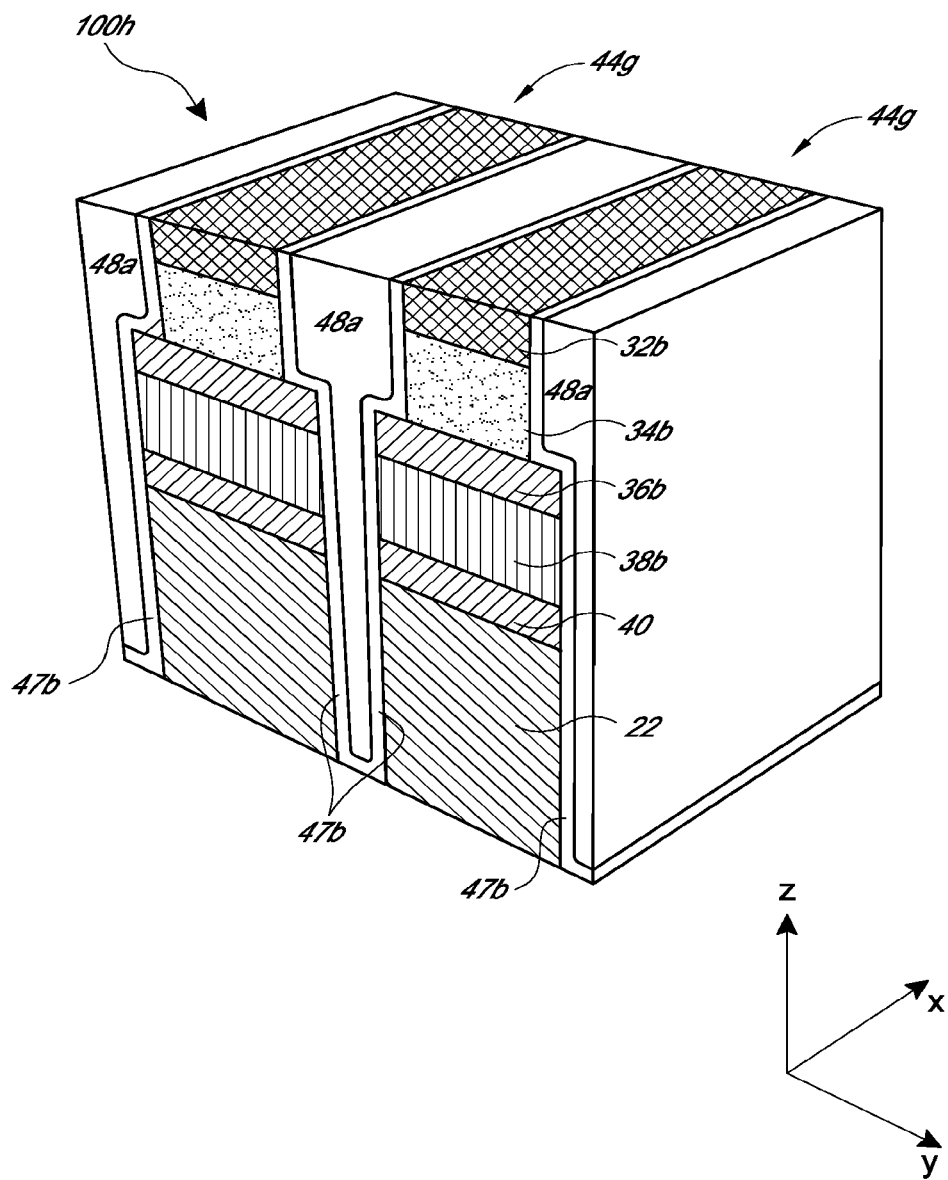
Figure 2I:
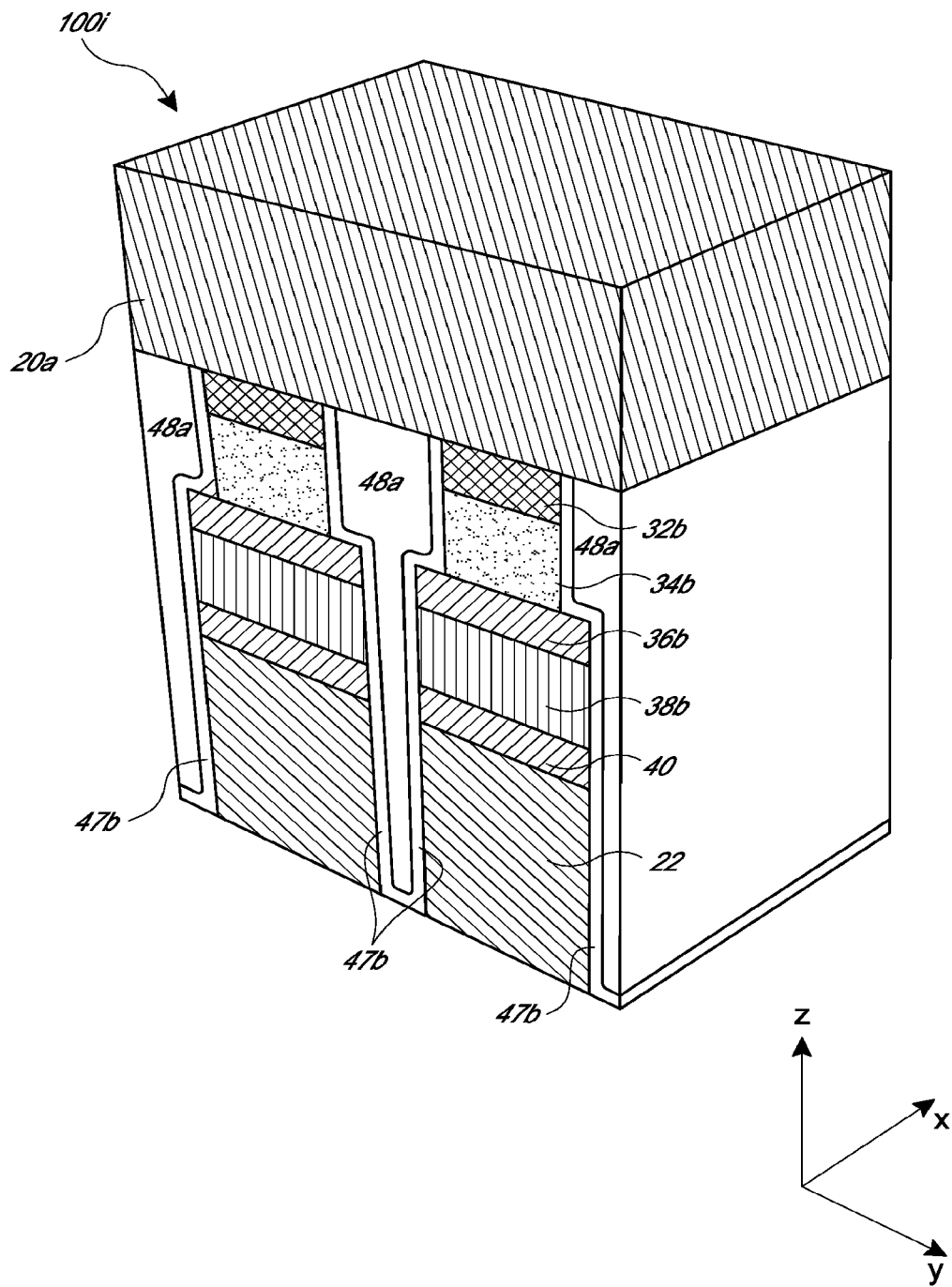
Figure 2J:
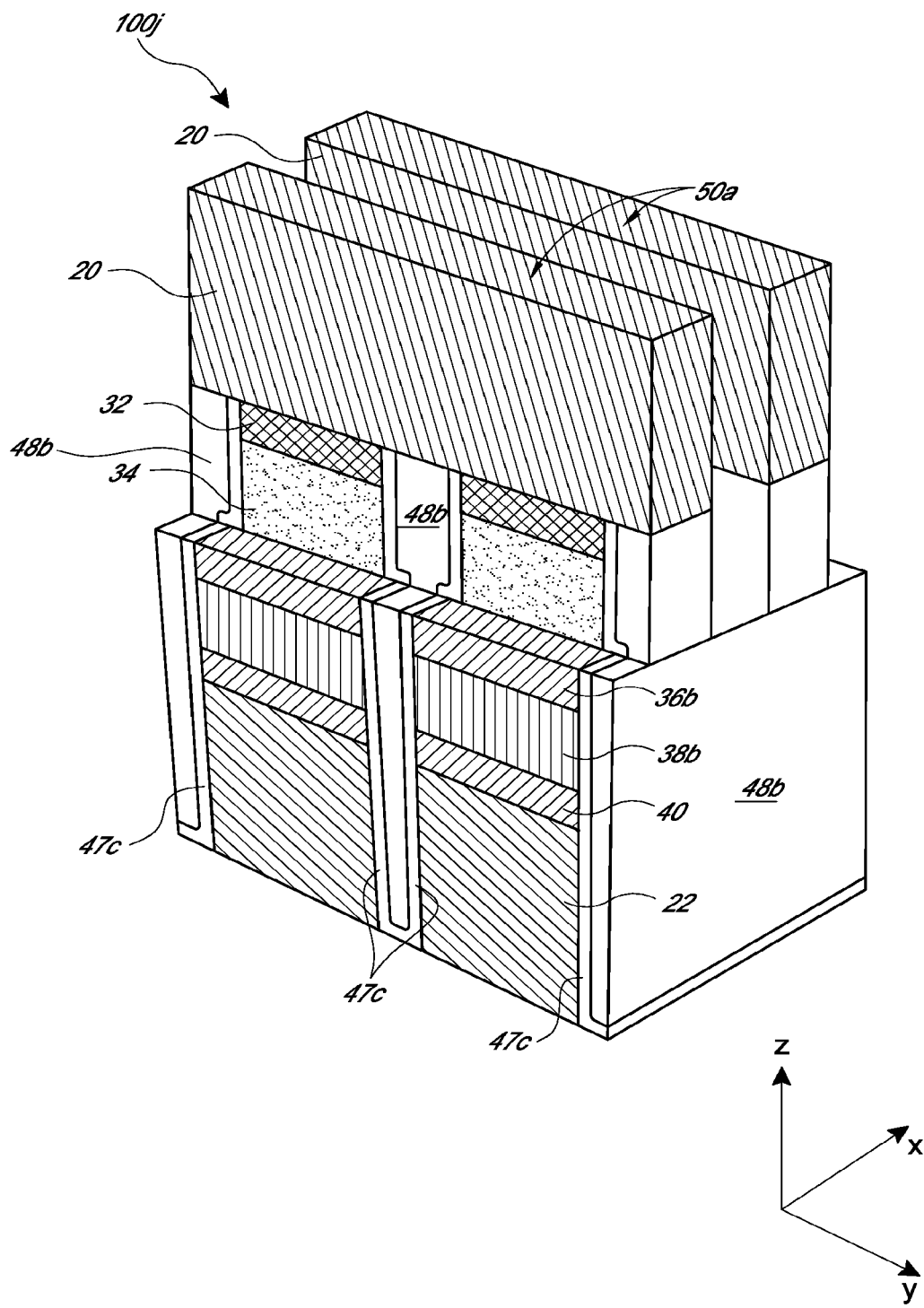
Figure 2K:
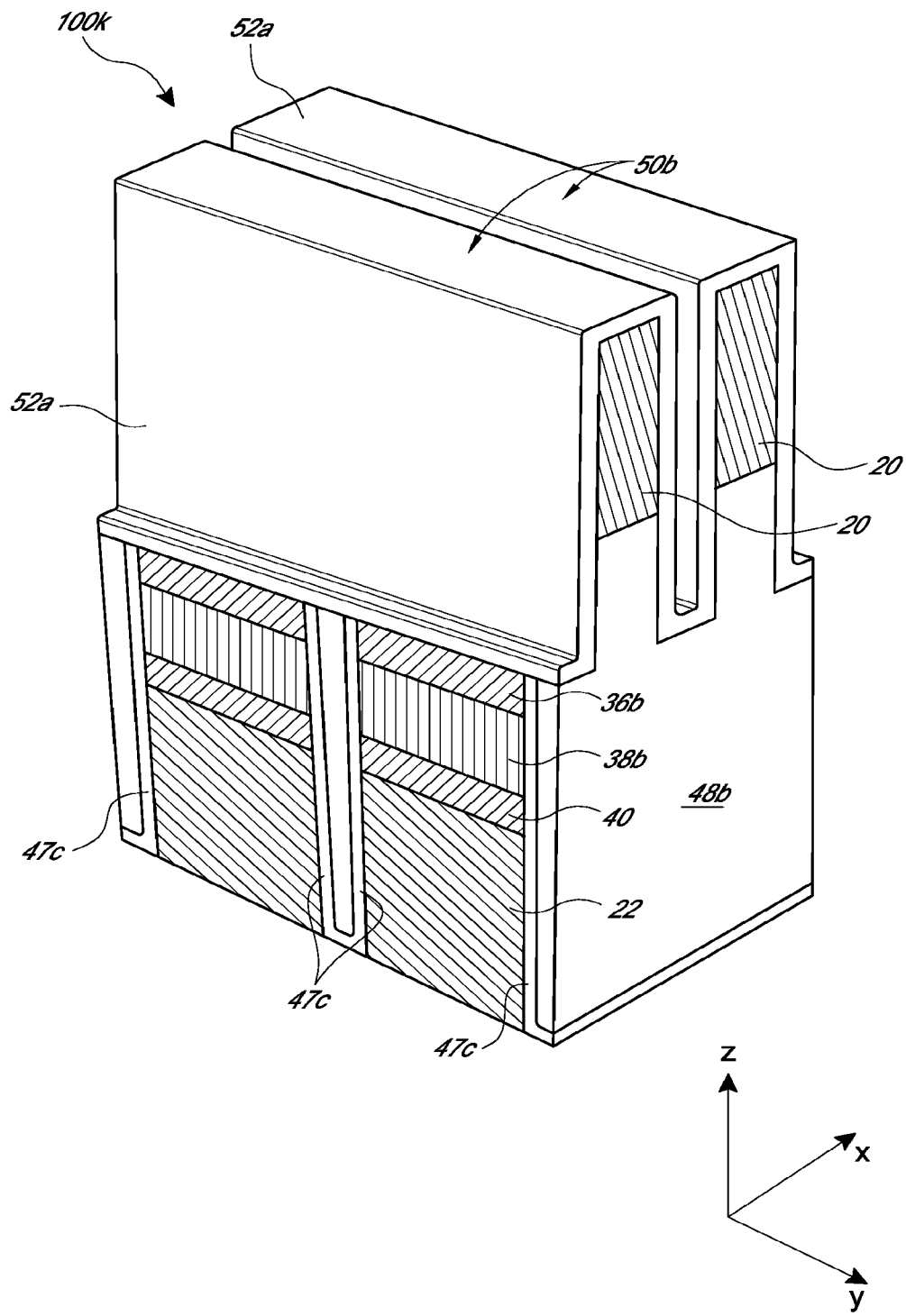
Figure 2L:
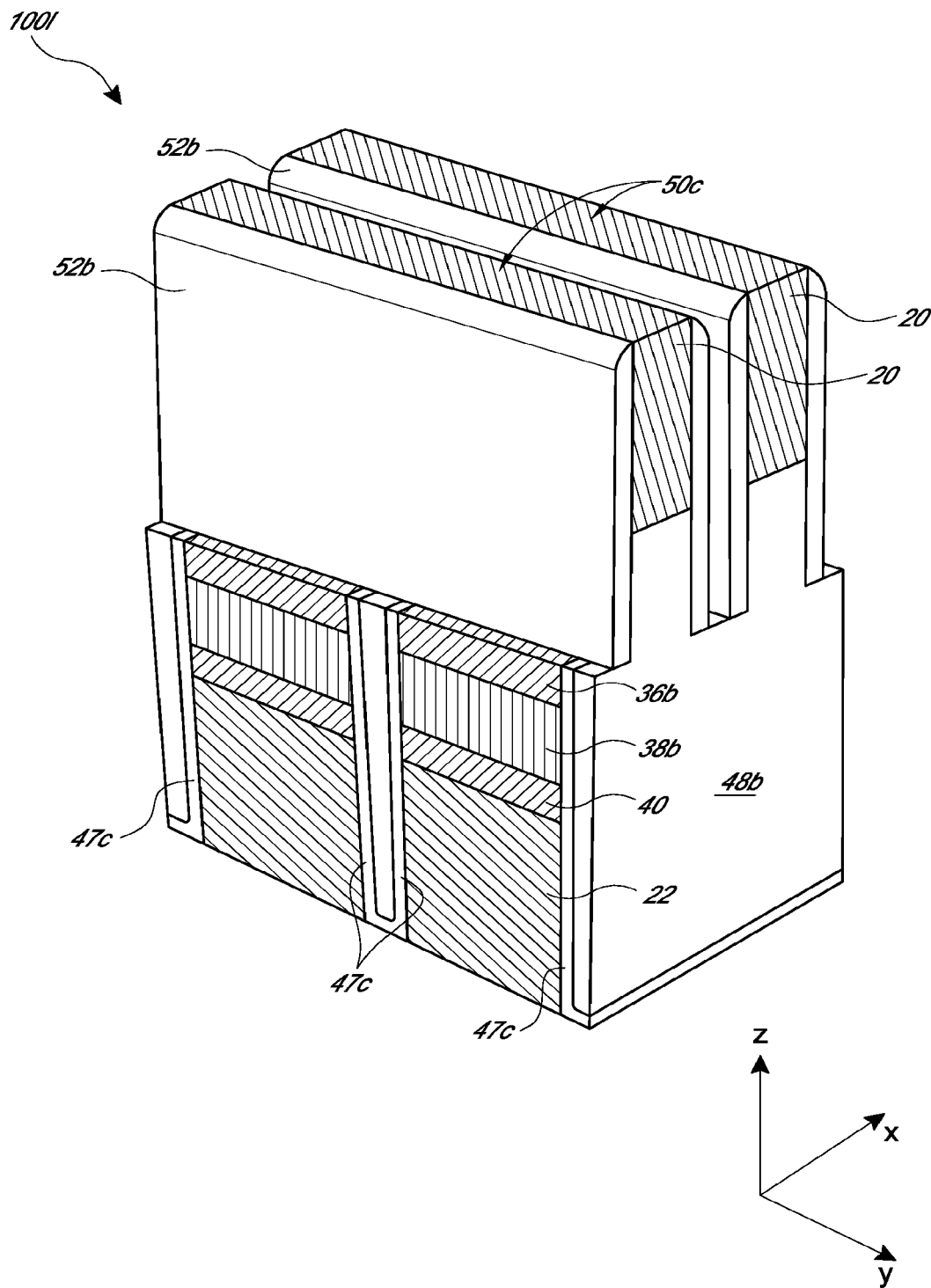
Figure 2M:
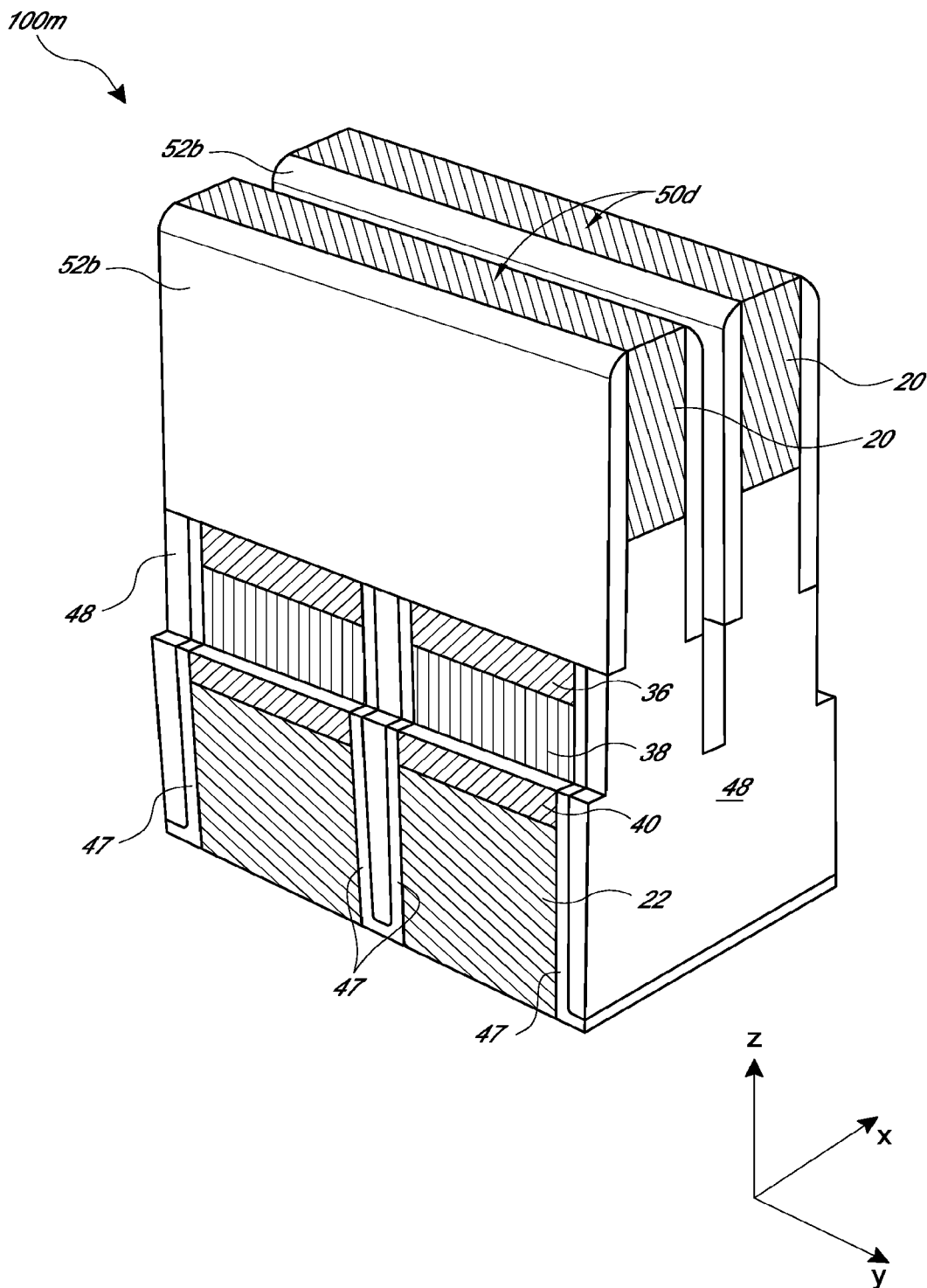
Figure 2N:
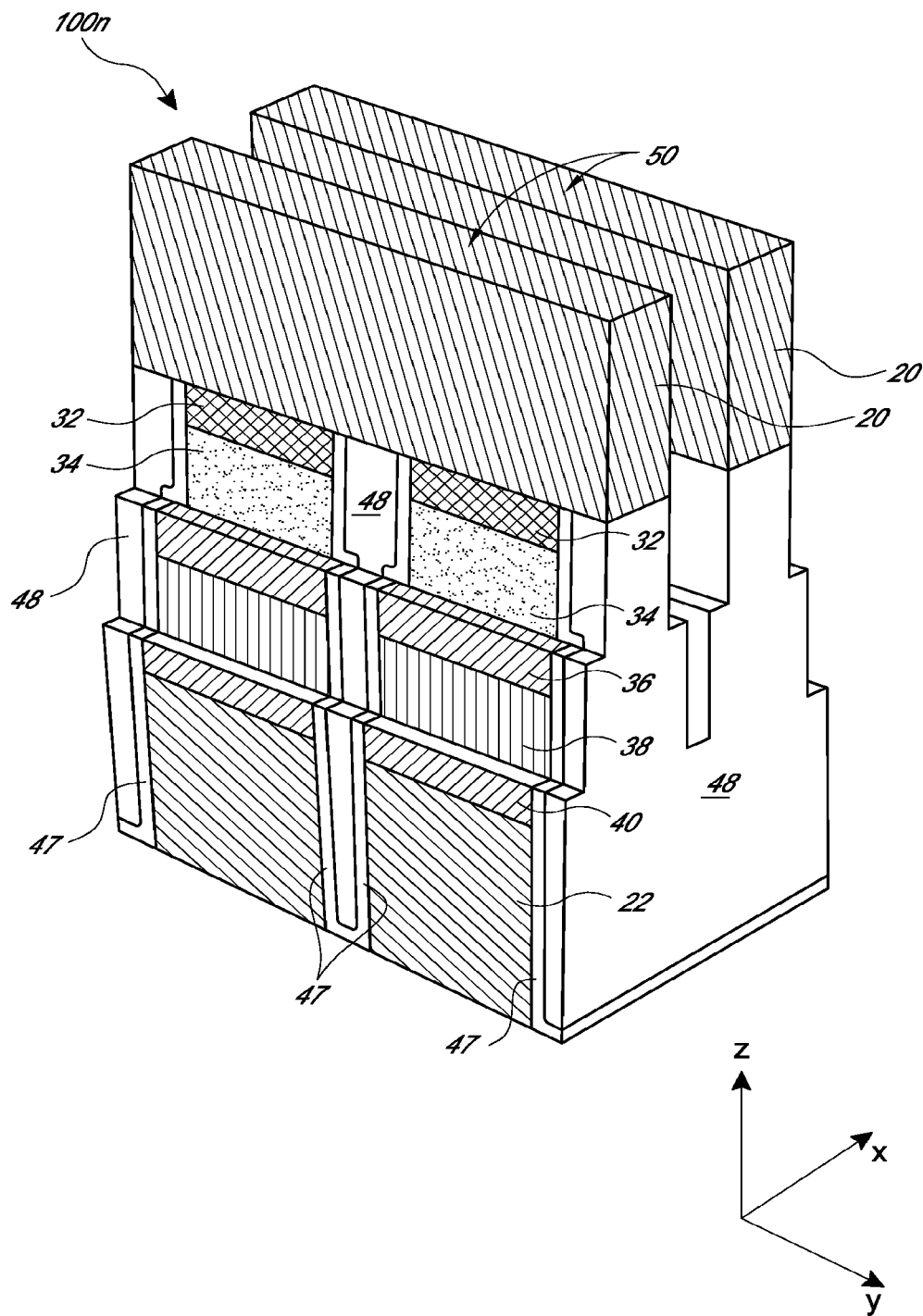

FIGS. 2A-2N are schematic three-dimensional depictions of intermediate memory array structures illustrating structures and methods of fabricating a memory device according to various embodiments. In an illustrated embodiment, fabrication includes partially etching a memory cell material stack and protecting the exposed sidewalls of the partially etched memory cell material stack prior to completing the etch to form stacked memory cell structures, such memory cell line stacks. The etch can be part of a patterning process in which a conductive line is commonly patterned with a memory cell stack. In the illustrated process, a lower row line and an upper column line are patterned using two mask patterns, and an intervening memory cell stack is partially patterned by each of the two mask patterns.

While not shown for clarity and ease of illustration, it will be understood that the illustrated array structures are formed over a substrate, which can include, among other things, various peripheral and supporting circuitry, for instance CMOS transistors that form a part of column and row driver circuitry and sense amplifier circuitry, as well as sockets and wiring that connect such circuitry to the memory array through the column lines and row lines described above. In addition, the substrate may include one or more memory arrays, or "decks" of arrays. As used herein, the term substrate can includes a bulk semiconductor substrate as well as integrated structures formed thereover.

As used herein and throughout the specification, "subtractive patterning" refers to a process sequence where structures to be defined are patterned by the removal of material. For example, a "subtractive patterning process" may include first lithographically providing etch mask structures overlapping areas to be patterned, followed by etching, such that materials in areas masked by the mask structures are protected while materials in exposed areas are removed by the etch removal process. The set of process steps for subtractive-patterning a stack of layers, can include, for example, providing an etch mask pattern that can comprise at one or more of a resist, a hard mask and anti-reflective coating. The resist may be patterned by a photolithography process, and that pattern can be transferred into lower hard mask and/or antireflective layers. Other lithographic techniques are also possible, including processes without hard mask layers. If hard mask layer(s) are included, the resist can be removed prior to using hard mask during etch of underlying materials. Thus the etch mask pattern can be provided by resist and/or hard mask layers at the time of transferring the pattern into the materials of interest. The etch mask pattern blocks areas covered by the mask pattern to protect the underlying material from being etched (e.g., wet or dry), while the etch mask pattern exposes areas not covered by the mask pattern to etch the exposed region of the material(s) to be etched.

Referring to intermediate array structure 100a of FIG. 2A, according to some embodiments, a method of fabricating a memory device includes forming a lower conductive material 22a over a substrate (not shown), forming a memory cell material stack 30a over the lower conductive material 22a, and forming a first hard mask material 42a over the cell material stack 30a. Forming the memory cell material stack 30a in turn includes forming a lower electrode material 40a on the lower conductive material 22a, forming a selector element material 38a on the lower electrode material 40a, forming a middle electrode material 36a on the storage element material 38a, forming a storage element material 34a on the middle electrode material 36a, forming an upper electrode material 32a on the storage element material 34a, and forming a first hard mask material 42a on the upper electrode material 32a. Each of the materials can be formed by blanket depositing a layer on the substrate, such as by sputtering or chemical vapor deposition. It will be understood that memory cell stacks may omit or add materials in other embodiments.

Referring to intermediate array structure 100b of FIG. 2B, according to some embodiments, the method of fabricating the memory device includes subtractive patterning the memory cell material stack of the intermediate array structure 100a of FIG. 2A to form a partially etched lower line stack 44a extending in the x-direction. After a mask is patterned over it, the substrate with the intermediate array structure 100a can be loaded into a dry etch tool. In one embodiment, the processes described below with respect to FIGS. 2B-2E can be conducted in the dry etch tool.

Subtractive patterning to form the partially etched lower line stack 44a includes forming an etch mask line pattern (e.g., photoresist pattern) comprising lines extending in the x-direction and etching the exposed regions between the etch mask pattern lines. At least the upper active material is etched. In the illustrated embodiment of FIG. 2B, etching the hard mask material 42a, the upper electrode material 32a, and the storage element material 34a, forms the partially etched lower line stack 44a including a storage element line 34b on the middle electrode material 36a, an upper electrode line 32b on the storage element line 34b, and a hardmask line 42b on the upper electrode line 32b. The resulting intermediate structure 100b includes partially etched lower line stacks 44a separated by shallow trenches.

It will be appreciated that, while in the illustrated embodiment of FIG. 2B, the etch process removes part of the storage element material 34a to expose its sidewalls, similar etch process can remove part of the selector element material 38a in embodiments where the vertical positions of the storage element material 34a and the selector element material 48a are switched according to some embodiments.

In addition, it will be appreciated that, while in the illustrated embodiment of FIG. 2B the etch extends to at least the upper surface of the middle electrode material 36a such that the exposed sidewalls of the storage material 34b and of the upper electrode 32b can subsequently be protected using a protective liner, the etch process can stop at other depths depending on which material(s) of the intermediate array structure 100a of FIG. 2A is sought to be protected during subsequent processing. For example, in some embodiments, the etch process can subsequently proceed to remove one or more of the middle electrode material 36a, the selector element material 34a, bottom electrode material 40a and the lower electrode material 22a, as will be understood from the description below of FIGS. 3A-3C.

Still referring to FIG. 2B, it will be further appreciated that, forming the partially etched lower line stack 44a can include at least partially etching into the material that underlies the storage material line 34b, in this case the middle electrode material 36a, in order to ensure exposure of sidewalls through the full thickness of the storage material for subsequent protection, which can result in exposure of sidewalls through part of the thickness of the middle electrode material 36a.

In general, dry etch processes may utilize chemical reactions by employing various etchants comprising, for example, at least one of a halide, such as a fluorine-, chlorine-, bromine- or iodine-containing vapor compound to form a volatile chemical compound with the material being removed. Some other dry etch processes may utilize physical energy by employing acceleration of charged species which may be etchants themselves, or a combination of the etchants and other species such as inert ions. Yet some other dry etch processes, such as reactive ion etching, may utilize a combination of both chemical reactions and physical energy for optimized etching performance.

It will be appreciated that some dry etch processes for patterning the partially etched lower line stack 44a of FIG. 2B includes multiple sub-processes to enhance the etch rate and/or profile. However, a sub-process tailored for removing a particular material within the various materials of the intermediate structure 100a of FIG. 2A can result in undesirable consequences. For example, after removing materials up to and including the storage element material 34a, if the etch process continues to further remove the middle electrode material 36a and the selector element material 38a, atoms, molecules, or clusters of etch byproducts from additional materials removed, such as the selector element material 38a, can be released and re-deposited elsewhere, for example on sidewalls of the storage element line 34b. Materials released from the selector material can contaminate the sidewalls or the bulk material of the storage element line 34b, resulting in unintended changes in electrical performance of the resulting memory cells, such as a shift in the threshold/switching voltage of the memory cells, to name one example. Examples of materials released from the selector material 38a that can be subsequently be incorporated into the storage element material 34a to undesirably alter its electrical behavior include Te, As, Ge, Si, Pb, Se, Al, C, Bi, and Sb among others. As and Se, in particular, can alter the behavior of a chalcogenide storage material, such as GST.

Of course, other cross-contamination can occur by any of the materials removed, or byproducts of etching, being redeposited on existing sidewalls any of the materials that have been already etched. Such contamination can occur during etching, or during subsequent processes, such as a wet-clean process or a gap fill process.

To avoid such unintended changes in the electrical performance of the memory cells that can result from the dry etch processes, it can be advantageous to form protective liners on sidewalls of etched layers after partially etching, for example, to form a partially etched lower line stack 44a of FIG. 2B, prior to continuing to etch the stack of the intermediate structure 100b. Thus, in the descriptions that follow, a method of forming protective liners on sidewalls of partially etched lower line stack 44a such as in FIG. 2B will be described.

Referring to intermediate array structure 100c of FIG. 2C, according to some embodiments, the method of fabricating the memory device includes forming a protective liner 46a on the surfaces of the partially etched lower line stack 44a of FIG. 2B, including the sidewalls, to form a partially etched lower line stack 44b having sidewalls covered with the protective liner 46a. The resulting intermediate structure 100c includes partially etched lower line stacks 44a (FIG. 2B) separated by shallow trenches (one shown), and the protective liner 46a formed on sidewall and bottom surfaces of the shallow trenches.

In some embodiments, the protective liner 46a can include a fluorocarbon material. As used herein, a fluorocarbon material includes any material having carbon and fluorine that may or may not have long range order, and includes polymeric chains and amorphous materials. Such fluorocarbon materials can be deposited in process chambers configured for at least one of deposition and etch processes. Advantageously, the fluorocarbon material can be deposited in-situ in the same dry etch chamber used to form the partially etched lower line stack 44a of FIG. 2B, as well as to perform subsequent etch processes for defining the lower line stack. By depositing the protective liner in-situ, additional processing time, equipment and materials can be reduced. For example, the fluorocarbon material deposited using plasma and fluorocarbon reactant gas species that include C and F, such as $CH_2F_2$, $CF$, $CF_2$, $CF_4$, $C_4F_6$, $C_4F_s$, $COF_3$ and $CHF_3$, to name a few.

In some embodiments, forming the protective liner 46a includes depositing a conformal liner material which uniformly and substantially covers all exposed surfaces of the intermediate structure 100b of FIG. 2B, including the sidewalls of the partially etched lower line stack 44a and inter-line stack regions between adjacent partially etched lower line stacks 44a. At least sidewalls of the upper active material are covered. In the illustrated embodiment, sidewalls of the hard mask lines 42b, upper electrode lines 32b, storage element lines 34b, and any exposed sidewalls of the middle electrode material 36a are covered. As used herein, a conformal material has thicknesses on various portions of deposited surfaces that are substantially the same. Thus, when conformal, the protective liner 46a has substantially the same thicknesses on top surface and sidewalls of the partially etched lower line stack 44b, as well as on the middle electrode material 36a between adjacent partially etched lower line stacks 44b.

It will be appreciated that conformal protective liner 46a can advantageously enable a subsequent spacer structure formation (described further below). Some process conditions, such as a lower substrate bias during deposition and /or higher process chamber pressure compared to the conditions used for the vertical etch resulting in FIG. 2B can facilitate formation of a conformal protective liner 46a. Without being bound to any theory, such process conditions can retard acceleration of the etchant species toward the substrate. For example, if dry etch conditions for etching to define the storage material lines 34b include lower pressures of about 1-20 mTorr and a high substrate bias of about −200 V to −500 V, the pressures can be increased to about 30-50 mTorr and substrate bias reduced to −50 V to +50 V, particularly 0 V (no substrate bias) for greater isotropic processing and more conformal deposition of the protective liner 46a.

In other embodiments, the conformal protective liner 46a can be deposited ex situ, in which case an inorganic material such as silicon nitride can be employed.

It will be appreciated that the thickness of the protective liner 46a can be tailored for effective protection from cross-contamination, as well as controlling the resulting variations in the widths of the layers above and below the interface between the storage element line 34b and the middle electrode layer 36a in FIG. 2C. In some embodiments, the protective liners can have a thickness between about 5% and about 25% of a width of the cell line stack 30b measured at the same vertical height, or between about 10% and 20%, for instance about 15%. In some embodiments, the protective liners can have a thickness between about 1 nm and about 20 nm, or between about 1 nm and about 10 nm, for instance about 5 nm.

Referring to intermediate array structure 100d of FIG. 2D, the method of fabricating the memory device additionally includes, according to some embodiments, anisotropically removing horizontal portions of the protective liner 46a of FIG. 2C to expose the upper surfaces of the hard mask lines 42b and upper surfaces of the middle electrode material 36a between the partially etched lower line stacks 44c. The remaining protective liner 46b covers the sidewalls of the partially etched lower line stack 44c, including the sidewalls of the storage lines 34b. Such anisotropic removal may be referred to as "spacer etch process" in the industry, which refers to a directional etch process designed to remove materials predominantly in a vertical direction (z-direction) such that the protective liner 46a of FIG. 2C is substantially or completely removed from horizontal surfaces (e.g., surfaces formed in the x-y plane), while the protective liner 46b remains over vertical surfaces (e.g., surfaces formed in the x-z and y-z planes), and can be referred to as a protective spacer. After anisotropically etching to remove the protective liner material from the bottom surfaces of the shallow trenches, the resulting intermediate structure 100d includes partially etched lower line stacks 44a separated by shallow trenches, and the protective liners 46b formed on sidewall surfaces of the shallow trench.

The spacer etch can be conducted in the same dry etch chamber as subsequent etching described with respect to FIG. 2E below. In embodiments in which the protective liner 46a is formed in situ within a dry etch tool, the same tool can be employed for the sequence of FIGS. 2B-2E.

Referring to intermediate array structure 100e of FIG. 2E, according to some embodiments, once the protective liner 46a of FIG. 2C is anisotropically etched to expose the upper surfaces of the hard mask line 42b and the upper surfaces of the middle electrode material 36a between the partially etched lower line stacks 44c, the intermediate array structure of 100d of FIG. 2D, including remaining thickness of the middle electrode material 36a that may have been partially etched in the prior step, is further etched to define fully etched lower line stacks 44d as shown in FIG. 2E. The fully etched lower line stacks 44d include, starting from the bottom, a lower conductive line 22 on the substrate, a cell line stack 30c on the lower conductive line 22 and any remaining first hard mask line 42b on the cell line stack 30c. The cell line stack 30c includes a lower electrode line 40 on the lower conductive line 22, a selector element line 38b on the lower electrode line 40, a middle electrode line 36b on the selector element line 38b, a storage element line 34b on the middle electrode line 36b, and an upper electrode line 32b on the storage element line 34b. It will be appreciated that under some circumstances, the first hard mask material 42a may be substantially removed near the completion of the subtractive patterning process that forms the lower line stack 44d. The protective liners 46b protect sidewalls of the upper or second active material, which in the illustrated embodiment is represented by the storage element line 34b, during the further etch. In particular, the storage element line 34b, the upper electrode line 32b and any remaining hard mask line 42b above the middle electrode line 36b have sidewalls covered by the protective liners 46b while the remainder of the stack is wider because it is etched under the shadow of the protective liners 46b to form the fully etched lower line stack 44d of FIG. 2E. Any etch byproducts that may be released or resputtered during etching to form structures below the protective liners 46b, including the middle electrode line 36b, the selector element line 38b, the lower electrode line 40 and the lower conductive line 22, may be formed on the sidewalls of the protective liners 46b while being prevented from directly redepositing on sidewalls of the structures covered by the protective liners 46b, including the storage element line 34b and the upper electrode line 32b.

Referring FIG. 2F, according to some embodiments, the method of fabricating the memory device additionally includes removing the protective liners 46b to expose sidewalls of the storage element line 34b, the upper electrode line 32b and any remaining hard mask line 42b. By doing so, the protective liner 46b, whose surfaces may have byproducts from etching layers below the spacer-shaped protective liners 46b redeposited thereon as described above, including atoms, molecules, or clusters of the selector element material (e.g., As, Se), can be removed without directly exposing the sidewalls of the storage line 34b to the byproducts. In various embodiments, cleaning to remove the protective liner 46b can be performed using any suitable wet and/or dry cleaning processes known in the art for cleaning dry-etched surfaces. For example, one such cleaning process may include wet and/or vapor cleaning using a solution including dilute hydrofluoric acid (HF) at a concentration between about 0% and 10%, or between about 0% and 5%. Another such cleaning process may include wet and/or vapor cleaning using a solution including carboxylic acid at a concentration between about 0% and about 2%, or between about 0% and about 1%, or between about 0% and about 0.5%. In other embodiments, where an ex situ deposited inorganic spacer is employed, the protective liners may remain in place through subsequent processing and may remain in the final product.

Still referring to FIG. 2F, it will be appreciated that as a result of removing the protective liner 46b, different portions of the fully etched lower line stack 44e can have different widths depending on whether the portion was etched before or after forming the protective liners 46b. In the illustrated embodiment, because the protective liners 46b were formed after etching to form the storage element line 34b, the widths of the portions of the fully etched lower line stack 44e above and below the exposed top surface of the middle electrode line 36b can be different by an amount corresponding to the thickness of the protective liners 46b in FIG. 2E. In some embodiments, the difference in widths between the wider and narrower portions of the cell line stack can be between about 10% and about 50% of the width of the cell line stack 30b measured immediately above the same vertical level, or between about 20% and 40%, for instance about 30%. In some embodiments, the protective liners can have a thickness between about 1 nm and about 20 nm, or between about 1 nm and about 10 nm, for instance about 5 nm.

Referring FIG. 2G, according to some embodiments, the method of fabricating the memory device additionally includes forming a sealing dielectric 47a on exposed surfaces of the fully etched lower line stack 44e, after removing the protective liners 46b as described with respect to FIG. 2F, to form the intermediate array structure 100g. Unlike the protective liners 46b formed in situ in the dry etch tool, the sealing dielectric 47a can remain permanently on at least some surfaces of the fully etched lower line stack 44f. In some embodiments, the sealing dielectric 47a can include a suitable dielectric to protect at least portions of the lower line stack 44f from subsequent processes such as subsequent etching to confine the stack in the y dimension (see FIGS. 2H-2N), cleaning, gapfill and thermal processes. The sealing dielectric 47a can include oxide materials, such as silicon oxide (e.g., $SiO_2$) and aluminum oxide (e.g., $Al_2O_3$), nitride materials, such as silicon nitride (e.g., $Si_3N_4$), or combinations thereof, among others. In general, the sealing dielectric 47a can be formed by a suitable conformal deposition technique such as chemical vapor deposition (CVD) and atomic layer deposition (ALD), including thermal and plasma deposition techniques.

Referring to FIG. 2H, according to some embodiments, the method of fabricating the memory device additionally includes filling spaces between adjacent lower line stacks 44f of FIG. 2G with an isolation dielectric material to form first isolation dielectric regions 48a. Suitable dielectric materials to fill the spaces can include, for example, silicon oxide, which may be deposited by suitable gap-filling processes such as high-density plasma (HDP) processes, spin-on-dielectric (SOD) processes, sub-atmospheric chemical vapor deposition (SACVD) processes, and atomic layer deposition (ALD) processes, among others. Once the inter-line spaces between adjacent lower line stacks 44g are filled with the dielectric material to form the isolation dielectric regions 48a, the intermediate array structure can be chemical-mechanically polished to remove overlying gap fill dielectric and any remaining portions of the hard mask and expose a substantially planar surface comprising alternating surfaces of the upper electrode line 32b interposed by isolation dielectric regions 48a and sealing dielectrics 47b to complete formation of the lower line stack 44g of the intermediate structure 100h.

Referring now to intermediate array structure 100i of FIG. 2I, according to some embodiments, the method of fabricating the memory device additionally includes depositing an upper conductive material 20a on the planar surface of the intermediate array structure 100h. The upper conductive material 20a can comprise substantially similar materials and can be formed using substantially similar processes as discussed above for lower conductive material 22a of FIG. 2A.

Referring to intermediate array structure 100j of FIG. 2J, according to some embodiments, the method of fabricating the memory device additionally includes subtractively patterning to form a partially etched wall structure 50a including the upper conductive line 20. Forming the partially etched wall structure 50a includes, in a similar manner as described above for patterning the lower line stack 44a (FIG. 2B), forming an etch mask pattern comprising lines (e.g., photoresist lines, not shown for clarity) that cross with the underlying lower line stacks 44g, in the illustrated embodiment extending orthogonally in the y-direction, and etching the exposed regions to form the partially etched wall structures 50a. Each partially etched wall structure 50a includes an upper conductive line 20 and further includes forming an upper material stack confined in x- and y-directions, including an upper electrode 32 and a storage element 34. In the illustrated embodiment of FIG. 2B, similar to FIG. 2B, etching the wall structure 50a includes stopping the etch process on or within the middle electrode line 36b, to form the partially etched wall structure 50a. As discussed in FIG. 2B, stopping the etch at the middle electrode line 36b as shown in FIG. 2J is for illustrative purposes only, and the etch can stop at any suitable vertical position above and below the exposed surface of the middle electrode line 36b as shown in FIG. 2J.

Referring to intermediate array structure 100k of FIG. 2K, according to some embodiments, the method of fabricating the memory device additionally includes, in a manner similar to that described with respect to FIG. 2C for forming the protective liner 46a, forming a second protective liner 52a over the partially etched wall structure 50a of FIG. 2J to form the partially etched wall structure 50b of FIG. 2K. Parameters and conditions for forming the second protective liner 52a can be similar to that described with respect to FIG. 2C for forming the protective liner 46a.

Referring to intermediate array structure 100l of FIG. 2L, according to some embodiments, the method of fabricating the memory device additionally includes, in a manner similar to that described with respect FIG. 2D for forming the first protective liners 46b, anisotropically etching the second protective liner 52a of FIG. 2K to form second protective liners 52b having spacer profiles. Parameters and conditions for forming the second protective liners 52b are similar to that described with respect to FIG. 2D for forming the first protective liners 46b.

Referring to intermediate array structure 100m of FIG. 2M, according to some embodiments, the method of fabricating the memory device additionally includes, in a manner similar to that described with respect to FIG. 2E for further etching to form the fully etched lower line stack 44d, further etching the intermediate structure 100l of FIG. 2L to form the fully etched wall structure 50d of FIG. 2M. Except for the difference in materials being etched and stopping on the upper surfaces of the lower electrode lines 40, the parameters and conditions for further etching to form the fully etched wall structure 50d can be similar to FIG. 2E. Because the cell line stack 30c (FIG. 2F) is already patterned in crossing lines, the fully etched wall structure 50d includes the column line 20 overlying pillars of the memory cell stack that alternate with isolation material 48. In other words, the etch separates the cell line stack into pillars.

During the further etch, the second protective liners 52b protect sidewalls in the z-y plane of the underlying upper or second active material, which in the illustrated embodiment is represented by the storage element 34 (FIG. 2J). The remainder of the stack is wider because it is etched under the shadow of the second protective liners 52b to form the fully etched upper line stack 44d of FIG. 2E As noted above with respect to FIGS. 2B-2E, in one embodiment the sequence of FIGS. 2J-2M is conducted in situ within dry etch tool without removing the substrate until after the fully etched wall structure 50d is formed. As described above, conditions for vertical dry etching (including high negative substrate bias and relatively low pressure for anisotropic etching) can be altered to be more conducive to conformal deposition (including lower or no substrate bias and relatively higher pressures), and an organic second protective liner 52a of FIG. 2K can be plasma deposited as a polymer with the supply of fluorocarbon precursors. Conditions can then be returned to those conducive to anisotropic dry etching and.

In another embodiment, the substrate can be removed between etching steps and an inorganic second protective liner 52a of FIG. 2K can be deposited in a separate tool. In this case the resultant second protective liners 52b of FIG. 2M can optionally remain in the final product, in contrast to the process described below with respect to FIG. 2N below.

Referring to intermediate array structure 100n of FIG. 2N, according to some embodiments, the method of fabricating the memory device additionally includes, in a manner similar to that described with respect to FIG. 2F for removing the first protective liners 46b, cleaning to remove the a second protective liners 52b from the sidewalls of the wall structure 50d and leave a wall structure 50. Except for the fact that the second protective liners 52b are removed from the sidewalls of the storage element 34, the upper electrode 32 and the upper conductive line 20, the parameters and conditions for cleaning to remove the second protective liners 52b can be similar to that described with respect to FIG. 2F for cleaning to remove the first protective liners 46b.

Similar to FIGS. 2F-2G, any etch byproducts that may be released during etching to form structures below the second protective liners 52b in FIG. 2M, including the middle electrode 36 and the selector element 38, can redeposit on the sidewalls of the second protective liners 52b while being prevented from directly redepositing on sidewalls of the structures covered by the second protective liners 52b, including the upper or second active material in the form of the storage element 34. In embodiments where the second protective liners 52b are to remain in the final product, such etch byproducts can be removed with the removal of the second protective liners 52b such that the byproducts do not come into direct contact with the storage element 34 and the upper electrode 32.

It will be appreciated that, as a result of removing the second protective liners 52b, different portions of the wall structure 50c can have different widths at different portions, depending on whether the portion is formed before or after the second protective liners 52a have been formed, in a manner described with respect to FIG. 2F. In some embodiments, due to the shadowing effect of spacers on both sides, the difference in widths of the wall structure 50 measured immediately above and below the vertical level of the exposed top surface of the middle electrode 36 can be between about 10% and about 50% of the width of the wall structure 50 measured immediately above the exposed top surface of the middle electrode 36, or between about 20% and 40%, for instance about 30%.

In addition, although not illustrated, after removing the second protective liners 52b as illustrated in FIG. 2N, the intermediate structure 100n can be further processed to form a second sealing dielectric (not shown) on exposed surfaces of intermediate structure 100m, in a similar manner as described in FIG. 2G for forming the sealing dielectric 47a. In addition, the spaces between adjacent wall structures 50 lined with the second sealing dielectric can be filled with a filler dielectric to form second isolation dielectric regions (not shown) and polished (not shown), in similar manner as described in FIG. 2H to expose alternating upper conductive lines 20 (or hard mask lines or etch stop materials thereover) interposed by second isolation dielectric regions and second sealing dielectrics.

Figure 3A:
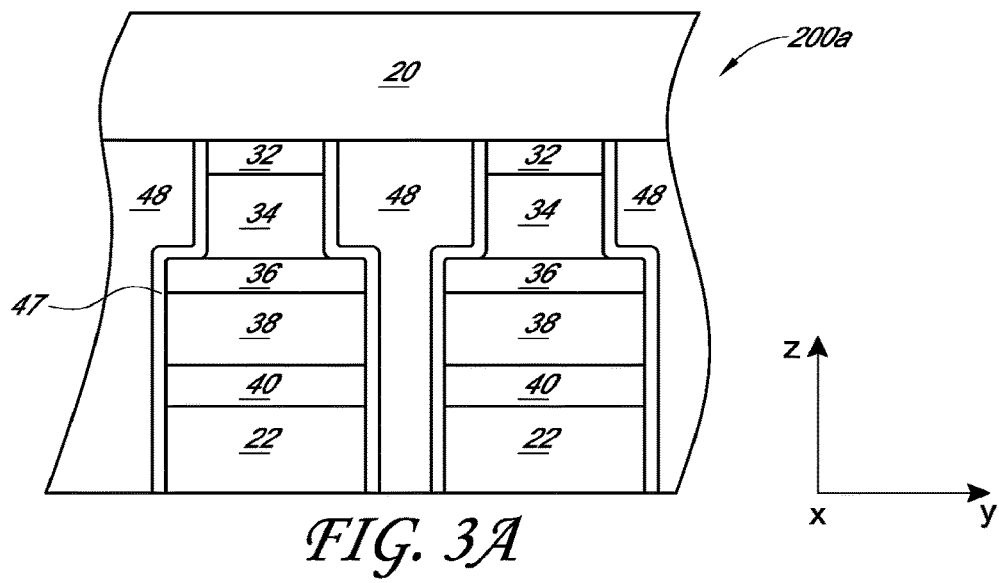
FIGS. 3A-3C are cross-sectional depictions of structures of memory cells according to some embodiments, where the cross-sections are taken in the y-z plane.

FIG. 3A illustrates a cross-sectional view of an array structure 200a fabricated according to the illustrated embodiments of FIGS. 2A-2N. The cross-section in FIG. 3A is taken in the y-z plane corresponding to the y-z plane of FIGS. 2A-2N. As described above, in this embodiment, the protective liners 46b (not shown) having spacer structures are formed and removed from sidewalls of the partially etched lower line stack 44c (FIG. 2D) including sidewalls of the storage element 34 and the upper electrode 32. After removing the protective liners 46b (not shown) and further etching to form the fully etched lower line stack 44e (FIG. 2F), a sealing dielectric 47 is formed to cover the x-z sidewalls of the entire stack below the upper conductive line 20 as shown in FIG. 3A. As described above, the cross-section of the array structure 200a shows, as a result of the protective liner 46b formation, steps form lateral plateau regions on an upper surface of the middle electrode 36 (which may be partially through the thickness of the upper electrode material) such that the width of the cell stack immediately below the upper surface of the middle electrode 36 is greater compared the width of the cell stack immediately above the upper surface of the middle electrode 36. As described above, such process flow can be desirable, for example, when materials above the step, such as upper active material in the form of the illustrated storage element 34, are sought to be protected from the etching processes of the layers below the step. Other configurations are possible, as illustrated in FIGS. 3B and 3C, in which similar parts are referenced by like reference numerals.

Figure 3B:
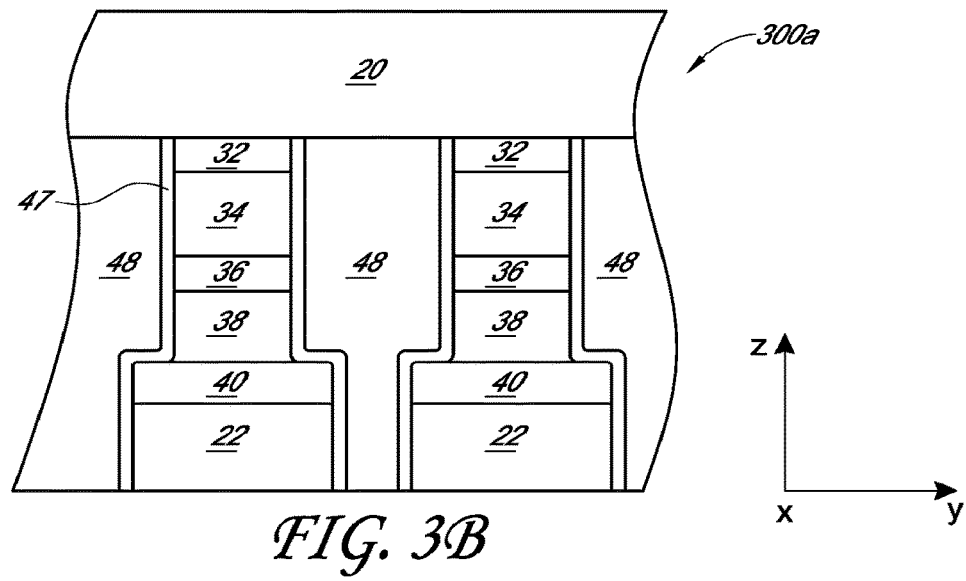

FIG. 3B illustrates a cross-sectional view of an array structure 300a according to another embodiment. Similar to FIG. 3A, the cross-section in FIG. 3A is taken in the y-z plane. In this embodiment, instead of initially stopping the etch removal process on the middle electrode material 36a as illustrated in FIG. 2B prior to formation of the protective liner 46b, the etch process is stopped on or within the lower electrode material 40a of FIG. 2B, and the subsequent protective liner (not shown) having a spacer structure is formed thereover. After removing the protective liner (not shown) and further etching to form the fully etched lower line stack, a sealing dielectric 47 is formed to cover the x-z sidewalls of the entire stack below the upper conductive line 20 as shown in FIG. 3B. As a result of the formation and removal of the protective spacer (not shown), steps form lateral plateau regions are on an upper surface of the lower electrode 40 (which may be partially through the thickness of the lower electrode material) such that the width of the cell stack immediately below the step is greater compared the width of the cell stack immediately above the step, as illustrated in the resulting cross-section of the array structure 300a in FIG. 3B. Such process flow can be desirable, for example, when materials above the step are sought to be protected from the etching processes of the lower electrode 40 or the lower conductive line 22, but the materials of the two active materials (storage element 34 and selector element 38) are compatible.

Figure 3C:
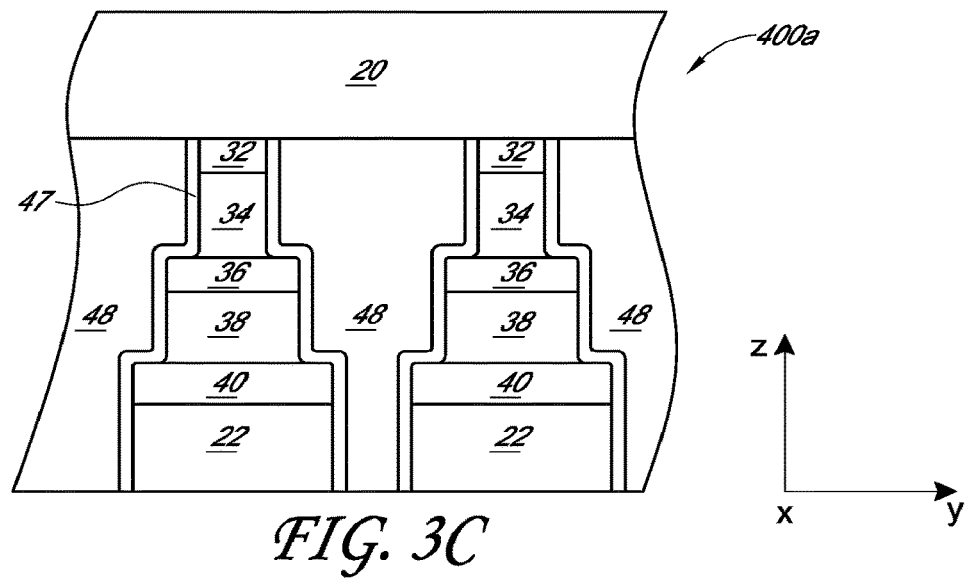

FIG. 3C illustrates a cross-sectional view of a fully fabricated array structure 400a according to yet another embodiment. Similar to FIGS. 3A and 3B, the cross-section in FIG. 3C is taken in the y-z plane. In this embodiment, in addition to stopping the etch removal process once on or within the middle electrode material 36a as in FIG. 3A, to form the protective liners 46b, in this embodiment the etch removal process stopped a second time on or within the lower electrode material 40a, and the protective liners having spacer structures (not shown) are formed thereover twice at both locations. After removing the protective liners after forming them at each location (not shown) and further etching to form the fully etched lower line stack, a sealing dielectric 47 is formed to cover the x-z sidewalls of the entire stack below the upper conductive line 20 as shown in FIG. 3C. The resulting cross-section of the array structure in FIG. 3C has steps forming lateral plateau regions on upper surfaces of the middle and lower electrodes 36 and 40 such that a width of the cell stack immediately below the lower step is larger compared to a width of the cell stack immediately above the lower step, and a width of the cell stack immediately below the upper step is larger than a width of the cell stack immediately above the upper step. Such process flow can be desirable, for example, when materials above the upper step are sought to be protected from etching processes of the middle electrode 36 and the selector element 38, and in addition, materials above the lower step are sought to be protected from the etching processes of the lower electrode 40 or the lower conductive line 22.

Figure 4:
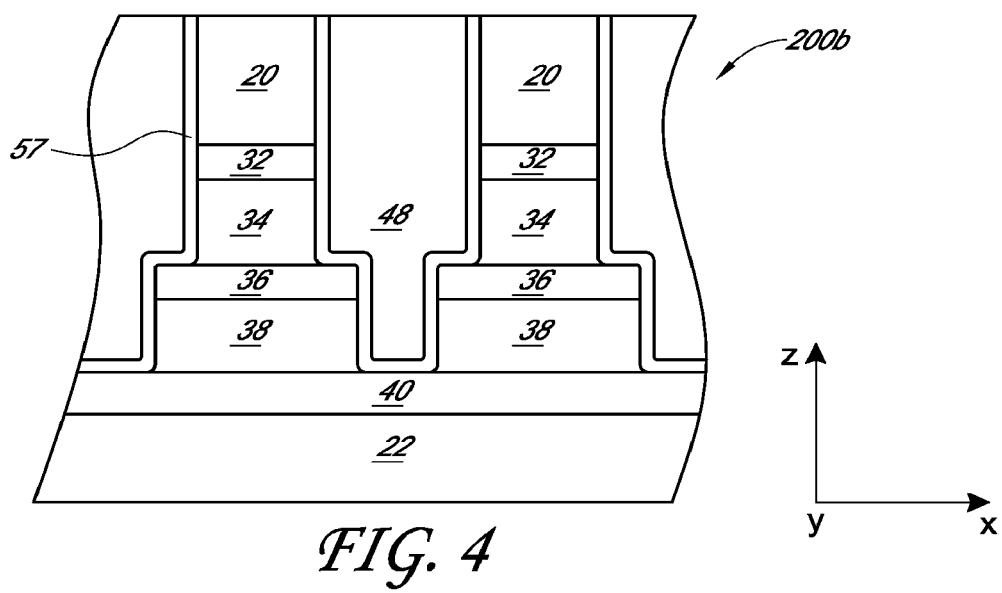
FIG. 4 is a cross-sectional depiction of a structure of memory cells according to some embodiments, where the cross-sections are taken in the x-z plane.

FIG. 4 illustrates a cross-sectional view of an array structure 200b corresponding to array structures 200a, 300a or 400a of FIGS. 3A-3C, according to some embodiments. The cross-section in FIG. 4 is taken in the x-z plane corresponding to the x-z plane of FIGS. 2A-2N. The array structure of FIG. 4 can be fabricated using similar processes as described with respect to FIGS. 2A-2N. However, it will be appreciated that spacer process used to protect the upper active material during column line etching, per FIGS. 2I-2N and FIG. 4, and the spacer process(es) use to protect the upper active material during row line etching, per FIGS. 2A-2H and 3A-3B, can be employed independently of each other or combined. In this dimension also the step can be formed on or within the middle electrode material, as shown.

Figure 5A:
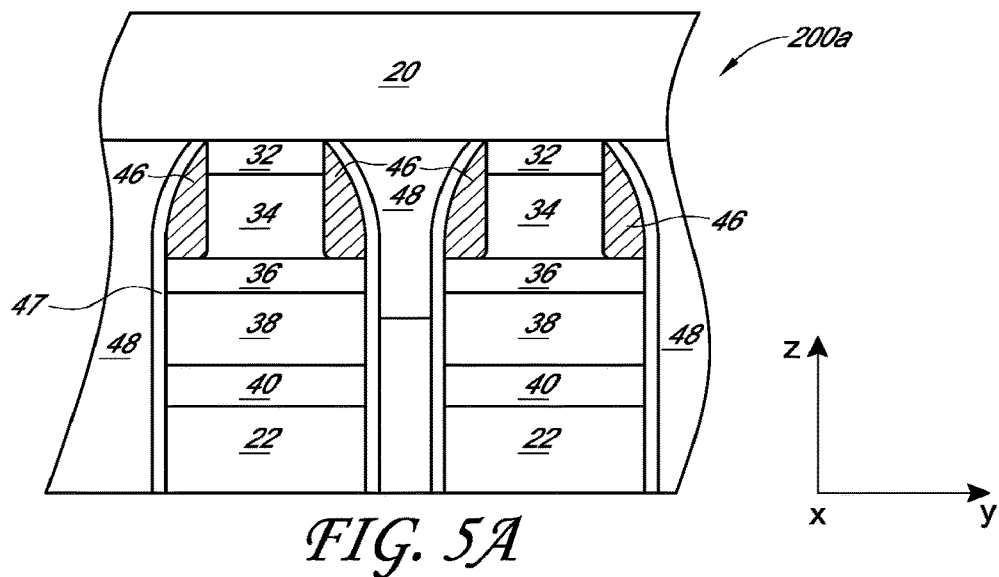
FIGS. 5A-5C are cross-sectional depictions of structures of memory cells according to some embodiments, where the cross-sections are taken in the y-z plane Features in the drawings are not necessarily drawn to scale and may extend in different directions from that illustrated. While various axes and directions are illustrated to facilitate the discussion herein, it will be appreciated that the features may extend in different directions.
Figure 5B:
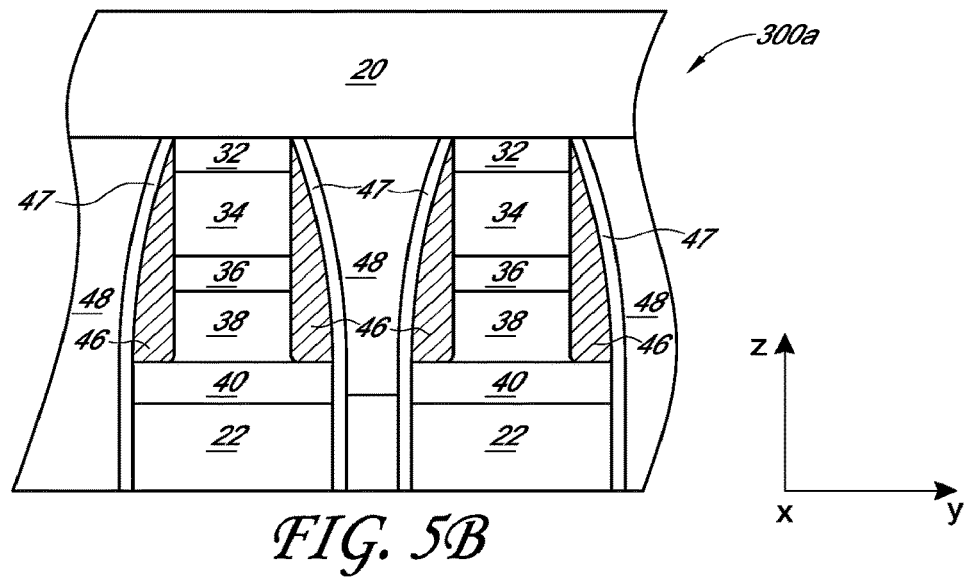
Figure 5C:
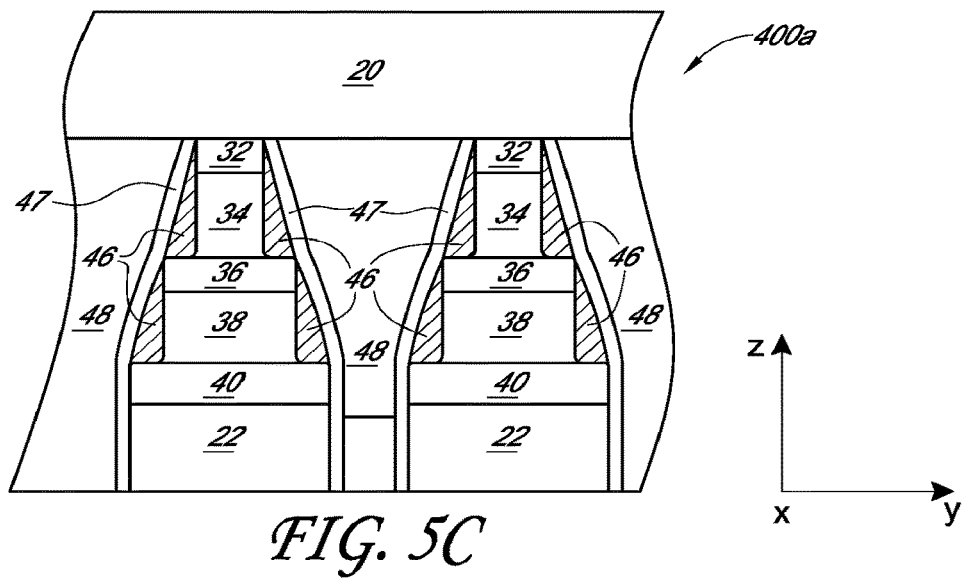

FIGS. 5A-5C illustrate cross-sectional views similar to those of FIGS. 3A 3C, except that the protective spacers 46 have not been removed. The protective spacers of the illustrated embodiments can be inorganic to minimize risk of interaction with the active materials (e.g., storage and selector elements) of the memory cell stack. Examples include silicon nitride and silicon oxynitride. It will be understood that the protective spacers on the orthogonal walls of the memory cell pillar (the dimension shown in FIG. 4) can similarly be maintained in the final product.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A memory device, comprising:
    a substrate;
    a lower conductive line disposed above the substrate and extending in a first direction; and
    an upper conductive line disposed above the lower conductive line and extending in a second direction different than the first direction; and
    a memory cell stack interposed between the lower and upper conductive lines, the memory cell stack comprising, an upper active element and a lower active element, wherein the memory cell stack includes:
        a first lateral plateau region such that a first width of the memory cell stack below the first lateral plateau region is wider than a second width of the memory cell stack above the first lateral plateau region; and
        a second lateral plateau region between the upper active element and the lower active element such that the second width is wider than a third width of the memory cell stack above the second lateral plateau region.

2. The memory device of claim 1, wherein the second width of the memory cell stack below the second lateral plateau region is between 10% and 50% wider than the third width of the memory cell stack above the second lateral plateau region.

3. The memory device of claim 1, wherein the memory cell stack further comprises:
    an upper electrode between the upper active element and the upper conductive line;
    a middle electrode between the upper and lower active elements; and
    a lower electrode between the lower active element and the lower conductive line.

4. The memory device of claim 3, wherein the second lateral plateau region is formed below the upper active element.

5. The memory device of claim 3, wherein the first lateral plateau region is formed below the lower active element and above the lower conductive line.

6. The memory device of claim 1, further comprising:
    a sealing dielectric having a first surface in contact with the memory cell stack and a second surface in contact with an isolation material, wherein the second surface includes the second lateral plateau region.

* * * * *